United States Patent
Kaneko

(10) Patent No.: US 7,981,770 B2
(45) Date of Patent: Jul. 19, 2011

(54) WAFER MACHINING METHOD FOR PREPARING A WAFER FOR DICING

(75) Inventor: Takayuki Kaneko, Mitaka (JP)

(73) Assignee: Tokyo Seimitsu Co., Ltd., Hachioji-shi, Tokyo (JP)

( * ) Notice: Subject to any disclaimer, the term of this patent is extended or adjusted under 35 U.S.C. 154(b) by 367 days.

(21) Appl. No.: 12/281,599

(22) PCT Filed: Feb. 28, 2007

(86) PCT No.: PCT/JP2007/053731
§ 371 (c)(1),
(2), (4) Date: Sep. 3, 2008

(87) PCT Pub. No.: WO2007/099986
PCT Pub. Date: Sep. 7, 2007

(65) Prior Publication Data
US 2009/0011572 A1    Jan. 8, 2009

(30) Foreign Application Priority Data
Mar. 3, 2006 (JP) ................................. 2006-058331

(51) Int. Cl.
*H01L 21/00* (2006.01)
(52) U.S. Cl. ................ 438/463; 438/460; 257/E21.599
(58) Field of Classification Search ................. 438/463, 438/460; 257/E21.599
See application file for complete search history.

(56) References Cited

U.S. PATENT DOCUMENTS 6,699,774 B2 *  3/2004  Takyu et al. .................. 438/460
7,179,721 B2    2/2007  Nagai
(Continued)

FOREIGN PATENT DOCUMENTS

EP    1 494 271 A1    1/2005
(Continued)

OTHER PUBLICATIONS

English Translation of the International Preliminary Report on Patentability and Written Opinion of the International Searching Authority for International Application No. PCT/JP2007/053731 Dated Sep. 18, 2008.

*Primary Examiner* — Thanh V Pham
*Assistant Examiner* — Duy T Nguyen
(74) *Attorney, Agent, or Firm* — Roberts Mlotkowski Safran & Cole, P.C.; David S. Safran

(57) ABSTRACT

A wafer working method which is capable of feeding a wafer diced by a laser dicing apparatus to a subsequent step without breaking the wafer. The wafer working method involves: a first machining step of grinding a reverse side of a wafer W and then polishing the reverse side of the wafer thus ground to a thickness which is larger than a finally worked wafer thickness; a modified region forming step of irradiating laser light to a region of the wafer thus subjected to the first machining which lies inwardly of a modification-free zone measuring 0.1 mm to 10 mm from a periphery of the wafer, to form a modified region inside the wafer; and a second machining step of grinding the reverse side of the wafer thus formed with the modified region and then polishing the reverse side of the wafer thus ground to the finally worked wafer thickness.

8 Claims, 19 Drawing Sheets

U.S. PATENT DOCUMENTS

| | | |
|---|---|---|
| 2004/0241962 A1 | 12/2004 | Nagai |
| 2005/0260829 A1* | 11/2005 | Uematsu et al. .............. 438/460 |
| 2005/0272223 A1 | 12/2005 | Fujii et al. |
| 2006/0148212 A1* | 7/2006 | Fukuyo et al. ................ 438/463 |
| 2007/0158314 A1* | 7/2007 | Fukumitsu et al. ........ 219/121.6 |
| 2008/0318362 A1* | 12/2008 | Miyazaki et al. ............. 438/113 |

FOREIGN PATENT DOCUMENTS

| | | |
|---|---|---|
| EP | 1 580 800 A1 | 9/2005 |
| EP | 1 610 364 A1 | 12/2005 |
| EP | 1 632 997 A2 | 3/2006 |
| EP | 1 635 390 A2 | 3/2006 |
| JP | 2002-192367 A | 7/2002 |
| JP | 2002-192368 A | 7/2002 |
| JP | 2002-192369 A | 7/2002 |
| JP | 2002-192370 A | 7/2002 |
| JP | 2002-192371 A | 7/2002 |
| JP | 2002-205180 A | 7/2002 |
| JP | 2004-241443 A | 8/2004 |
| JP | 2005-302982 A | 10/2005 |
| WO | 03/076118 A1 | 9/2003 |
| WO | 03/077295 A1 | 9/2003 |

* cited by examiner

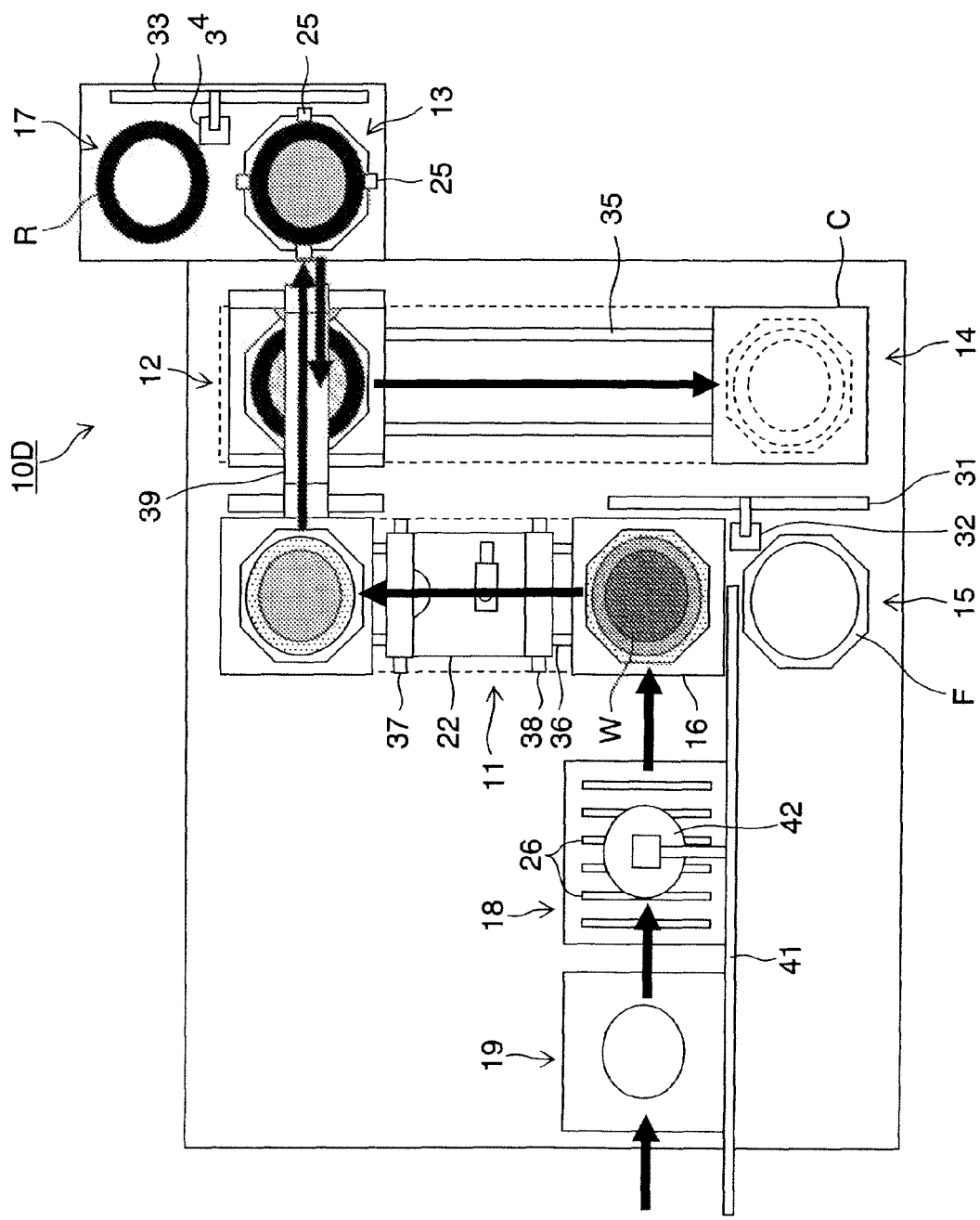

WAFER MACHINING METHOD FOR PREPARING A WAFER FOR DICING

BACKGROUND OF THE INVENTION

1. Field of Invention

The present invention relates to wafer working methods and, more particularly, to a wafer working method suitable for performing a process from surface machining to mounting of a semiconductor wafer cut to a chip size without causing any defect.

2. Description of Related Art

In a process for fabricating a semiconductor device, an electronic component, or the like, it is a general practice to subject a wafer formed with a semiconductor device, an electronic component, or the like on an obverse side thereof to process steps including probing, dicing, die bonding, and wire bonding and then to packaging with resin molding seal, to give a finished product of the semiconductor device, electronic component, or the like.

In recent years, there has been increasing demand for a very thin semiconductor device or electronic component to be incorporated into a memory card, a thin IC card, or the like. Accordingly, increasing demand exists for a very thin wafer having a thickness of not more than 100 μm. It has been a conventional practice to divide a wafer into individual chips by a dicing step after a probing step. Instead such a conventional practice, a process has now been adopted in which the reverse side of a wafer is subjected to grinding (back grinding) to give a very thin wafer having a thickness of not more than 100 μm prior to the dicing step and then the wafer is subjected to dicing.

Under such a background condition, a chip is fabricated by the following procedure as shown in a flowchart of FIG. 16 according to a conventional chip fabrication method for a semiconductor device, an electronic component, or the like.

Initially, for protection of the obverse side of a wafer on which a multiplicity of semiconductor devices, electronic components, or the like are formed, a protective sheet having adhesive on one side thereof (which is also called "protective tape") is affixed to the obverse side of the wafer (step S101). Subsequently, a back grinding step is performed to grind the wafer from the reverse side thereof to a predetermined thickness (step S103).

After the back grinding step, a frame mounting step of mounting the wafer on a dicing frame by using a dicing sheet having adhesive on one side thereof (which is also called "dicing tape"), is performed to unify the wafer and the dicing frame together (step S105). The wafer in this state is attracted on the dicing sheet side, and the protective sheet affixed to the obverse side of the wafer is peeled off (step S107).

The wafer from which the protective sheet has been peeled off, together with the frame, is conveyed to a dicing saw and then cut into individual chips by means of a diamond blade revolving at a high speed (step S109). The individual chips resulting from the cutting remain bonded to the dicing sheet S without being separated from each other and hence retain the form of a wafer as shown in FIG. 17. For this reason, an assembly of chips T retaining the form of a wafer will be referred to as "wafer W" for convenience.

The dicing sheet S on the wafer W thus cut is radially expanded in an expanding step, so that the spacing between adjacent ones of the individual chips T is expanded (step S111). In a chip mounting step, each chip T is mounted on a package base such as a lead frame (step S113). A chip is fabricated by such a process as described above.

The conventional chip fabrication method, however, involves a problem that when a very thin wafer W having a thickness of not more than 100 μm is subjected to cutting by dicing saw, a number of defective chips are produced due to chipping or cracking of the wafer W that occurs at the time of cutting.

As means for solving this problem, proposals have been made of techniques related to a laser beam machining method employed instead of cutting by the conventional dicing saw, wherein laser light having a focal point positioned inside the wafer W is allowed to become incident on the wafer W to form a modified region inside the wafer W by multiphoton absorption, thereby dividing the wafer W into individual chips T (see patent documents 1 to 6 for example).

The techniques proposed in the patent documents 1 to 6 noted above propose a dicing apparatus (hereinafter will be referred to as "laser dicing apparatus") which is configured to focus laser light L emitted from a laser light source LS onto the interior of the wafer W to form a continuous modified region K inside the wafer W as shown in FIG. 18 thereby dividedly cutting the wafer W, instead of a conventional dicing apparatus using a dicing saw.

Since the laser dicing apparatus divides a wafer into chips by using laser light instead of a diamond blade revolving at a high speed, a large force is not exerted on the wafer and, hence, chipping or cracking does not occur. Also, since the laser dicing apparatus does not have any portion to contact the wafer directly and hence does not allow heat or cutting swarf to be produced, no cutting water is needed. Further, since the modified region is formed inside the wafer to dividedly cut the wafer into chips, the spacing between adjacent chips is very narrow as compared with that resulting from cutting by diamond blade and, therefore, a larger number of chips can be obtained from one wafer.

Patent Document 1: Japanese Patent Application Laid-Open No. 2002-192367
Patent Document 2: Japanese Patent Application Laid-Open No. 2002-192368
Patent Document 3: Japanese Patent Application Laid-Open No. 2002-192369
Patent Document 4: Japanese Patent Application Laid-Open No. 2002-192370
Patent Document 5: Japanese Patent Application Laid-Open No. 2002-192371
Patent Document 6: Japanese Patent Application Laid-Open No. 2002-205180

With such a laser dicing apparatus, however, in some cases the wafer is undesirably broken up from the inside modified region as a starting point by impact or vibration that occurs during conveyance between apparatuses used in respective steps performed after dicing. The wafer, once broken up, cannot be handled as a wafer, which raises a problem that the subsequent steps are seriously hindered from proceeding.

In view of this problem, the inventor of the present invention has studied a method including: grinding and polishing the reverse side of a wafer to a thickness larger than a finally worked wafer thickness (first machining); irradiating laser light to the wafer to form a modified region inside the wafer; and then again grinding and polishing the reverse side of the wafer to the finally worked wafer thickness (second machining). This method has demonstrated a noticeable effect.

In this process, however, there has been observed in the second machining a phenomenon that due to the mechanical strength of the wafer lowered by the modified region, chipping occurs at a peripheral portion of the wafer and the resulting chipping is caught between a grinding wheel and the wafer to cause a scratch or caught between a polishing pad and the wafer to cause a flaw.

When such chipping is large, a notch portion or an orientation flat portion of the wafer may be damaged to give rise to an inconvenience in wafer alignment.

SUMMARY OF THE INVENTION

The present invention has been made in view of the foregoing problems and, accordingly, an object of the present invention is to provide a wafer working method capable of working a wafer diced by the laser dicing apparatus without causing any defect.

In order to accomplish the foregoing object, the present invention provides a wafer working method characterized by comprising: a first machining step of grinding a reverse side of a wafer and then polishing the reverse side of the wafer thus ground to a thickness T2 which is larger than a finally worked wafer thickness T1; a modified region forming step of irradiating laser light to a region of the wafer thus subjected to the first machining which lies inwardly of a modification-free zone measuring 0.1 mm to 10 mm from a periphery of the wafer, to form a modified region inside the wafer; and a second machining step of grinding the reverse side of the wafer thus formed with the modified region and then polishing the reverse side of the wafer thus ground to the finally worked wafer thickness T1.

In the wafer working method according to the present invention, wherein: the wafer is machined to the thickness T2 by the first machining; laser light is irradiated to the wafer to form the modified region inside the wafer; and the wafer is machined to the finally worked wafer thickness T1 by the second machining, the modification-free zone measuring 0.1 mm to 10 mm from the periphery of the wafer is not irradiated with laser light.

Accordingly, the modified region is not formed in the modification-free zone and, hence, the mechanical strength of the wafer in the modification-free zone is not lowered. Thus, the problem of chipping at a peripheral portion of the wafer can be eliminated.

As a result, the phenomenon is not observed that chipping is caught between the grinding wheel and the wafer to cause a scratch or caught between the polishing pad and the wafer to cause a flaw. Nor does occur the problem that a notch portion or an orientation flat portion of the wafer is damaged.

As described above, according to the present invention it is possible to divide a wafer diced by the laser dicing apparatus into chips without any damage to the wafer.

The thickness T2 is preferably larger than the finally worked thickness T1 by 50 μm to 500 μm, more preferably by 100 μm to 300 μm, further more preferably by 150 μm to 250 μm.

Preferably, the present invention includes: a tape affixing step of affixing a protective tape to an observe side of the wafer before the first machining for protecting a pattern formed on the obverse side of the wafer; an ultraviolet light irradiating step of irradiating ultraviolet light to the obverse side of the wafer having been subjected to the second machining; a tape mounting step of affixing a dicing tape to the reverse side of the wafer thus irradiated with ultraviolet light and mounting the wafer on a frame; a tape peeling step of peeling off the protective tape affixed to the obverse side of the wafer thus mounted on the frame; and an expanding step of expanding spacing between adjacent chips of the wafer by expanding the dicing tape from the dicing tape affixed side of the wafer from which the protective tape has been peeled off.

Thus, it is possible to complete the steps including the back grinding, UV light irradiation, mounting on the frame, protective sheet peeling, and expanding, with the wafer moving a small distance within the system. Therefore, the possibility of damage to chips during conveyance or operation in each step can be minimized. Since the wafer in an expanded state is stored in a cassette, it is possible to proceed with a chip mounting step immediately, which makes it possible to improve the throughput.

In the present invention, the modified region formed inside the wafer is preferably positioned apart from the obverse side of the wafer by a distance T1 in a thickness direction. When the modified region is so positioned in the thickness direction, the wafer can be dividedly cut easily.

Preferably, the present invention comprises a plasma cleaning step of plasma-cleaning the wafer having been subjected the second machining. The provision of such a cleaning step can improve the wafer quality.

As described above, according to the present invention it is possible to divide a wafer diced by the laser dicing apparatus into chips without any damage to the wafer.

BRIEF DESCRIPTION OF THE DRAWINGS

FIG. 9 is a plan view schematically showing the construction of a wafer mounting apparatus;

FIG. 16 is a flowchart showing a conventional method of fabricating a chip of a semiconductor device, electronic component or the like;

DETAILED DESCRIPTION OF THE INVENTION

Hereinafter, preferred embodiments of a wafer working method according to the present invention will be described in detail with reference to the attached drawings.

Figure 1:
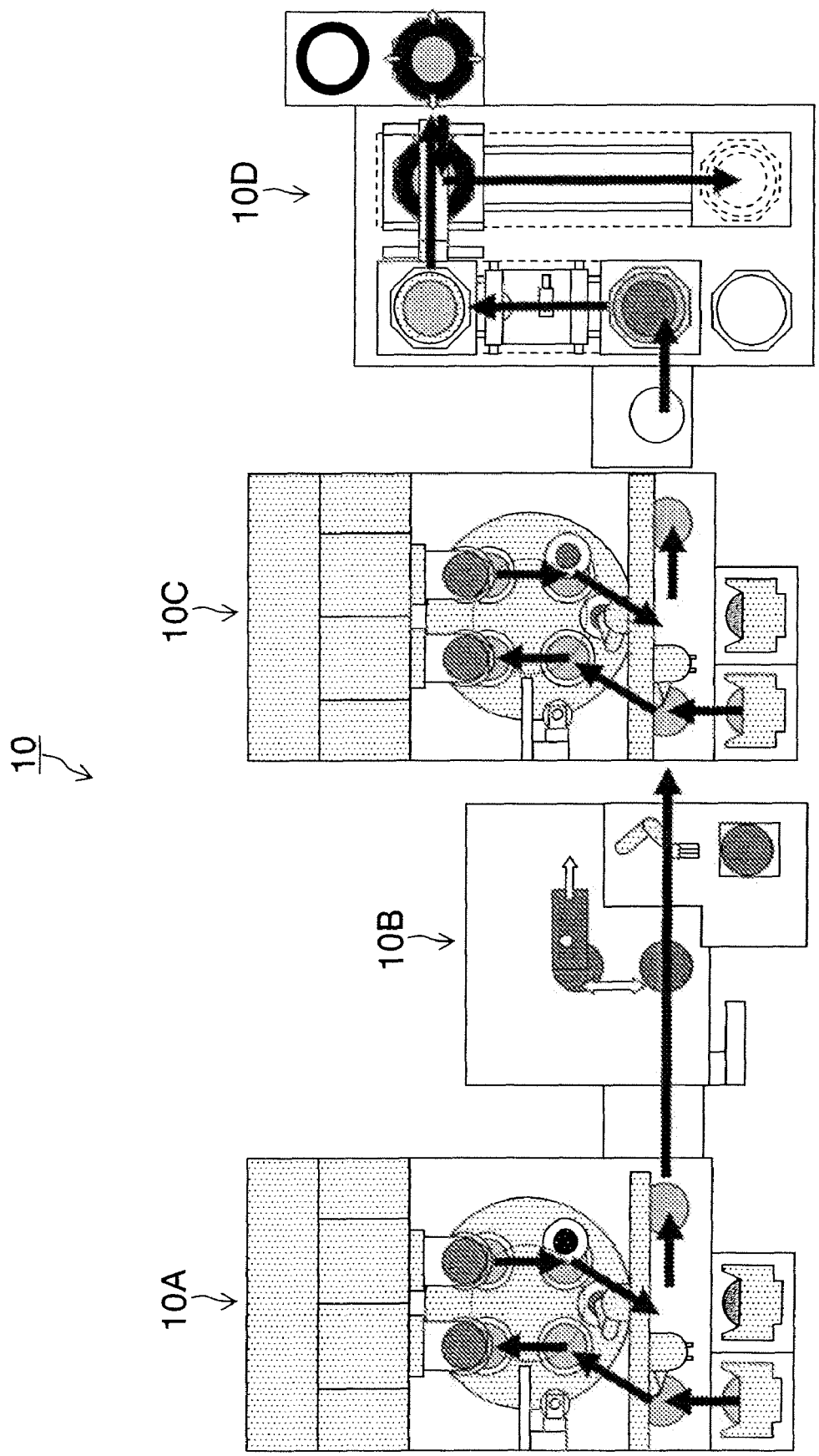
FIG. 1 is a plan view schematically showing a wafer working system to which a wafer working method according to the present invention is applied.

FIG. 1 is a plan view showing an overall configuration of a wafer working system 10 to which the present invention is applied. The wafer working system 10 comprises, from the upstream side (i.e., left-hand side), a surface machining apparatus 10A, a laser dicing apparatus 10B, a surface machining apparatus 10C, and a wafer mounting apparatus 10D. Description will be made of these apparatuses sequentially.

The surface machining apparatus 10A is used in a first machining step, and the surface machining apparatus 10C is used in a second machining step.

It is possible to use one surface machining apparatus 10A (or 10C) in both of the first and second machining steps without the provision of two such surface machining apparatuses as shown in FIG. 1.

Figure 2:
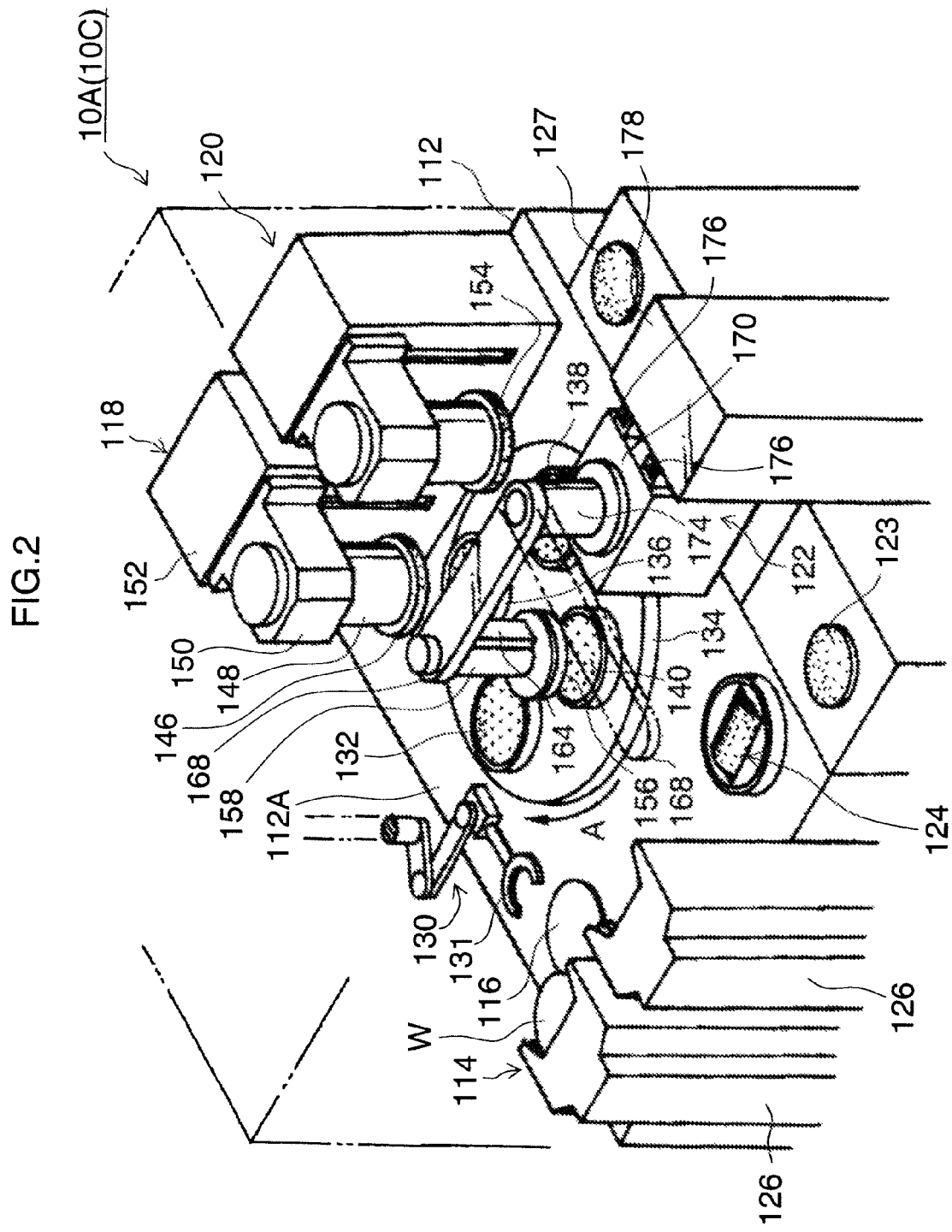
FIG. 2 is an overall perspective view showing a wafer surface machining apparatus.
Figure 3:
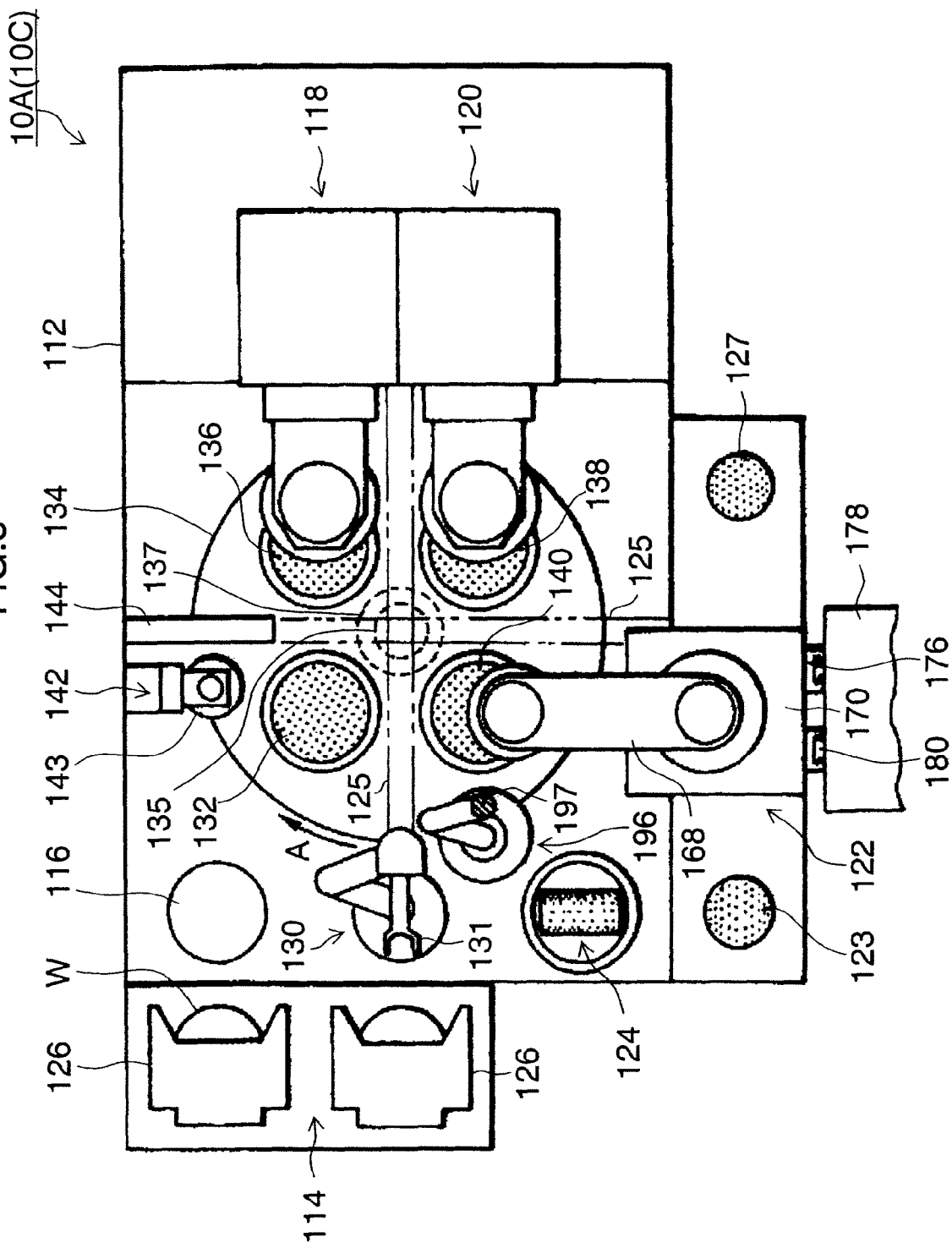
FIG. 3 is a plan view of the surface machining apparatus shown in FIG. 2.

FIG. 2 is a perspective view of the surface machining apparatus 10A (10C), and FIG. 3 is a plan view. As shown in FIG. 2, the surface machining apparatus 10A (10C) has a main body 112 provided with a cassette storage stage 114, an alignment stage 116, a rough grinding stage 118, a precision grinding stage 120, a polishing stage 122, an abrasive cloth cleaning stage 123, a abrasive cloth dressing stage 127, and a wafer cleaning stage 124.

The rough grinding stage 118, precision grinding stage 120 and polishing stage 122 are separated from each other with a partition plate 125 depicted by dashed double-dotted line in FIG. 3 to prevent a machining liquid used in each of the stages 118, 120 and 122 from scattering to an adjacent stage.

Figure 5:
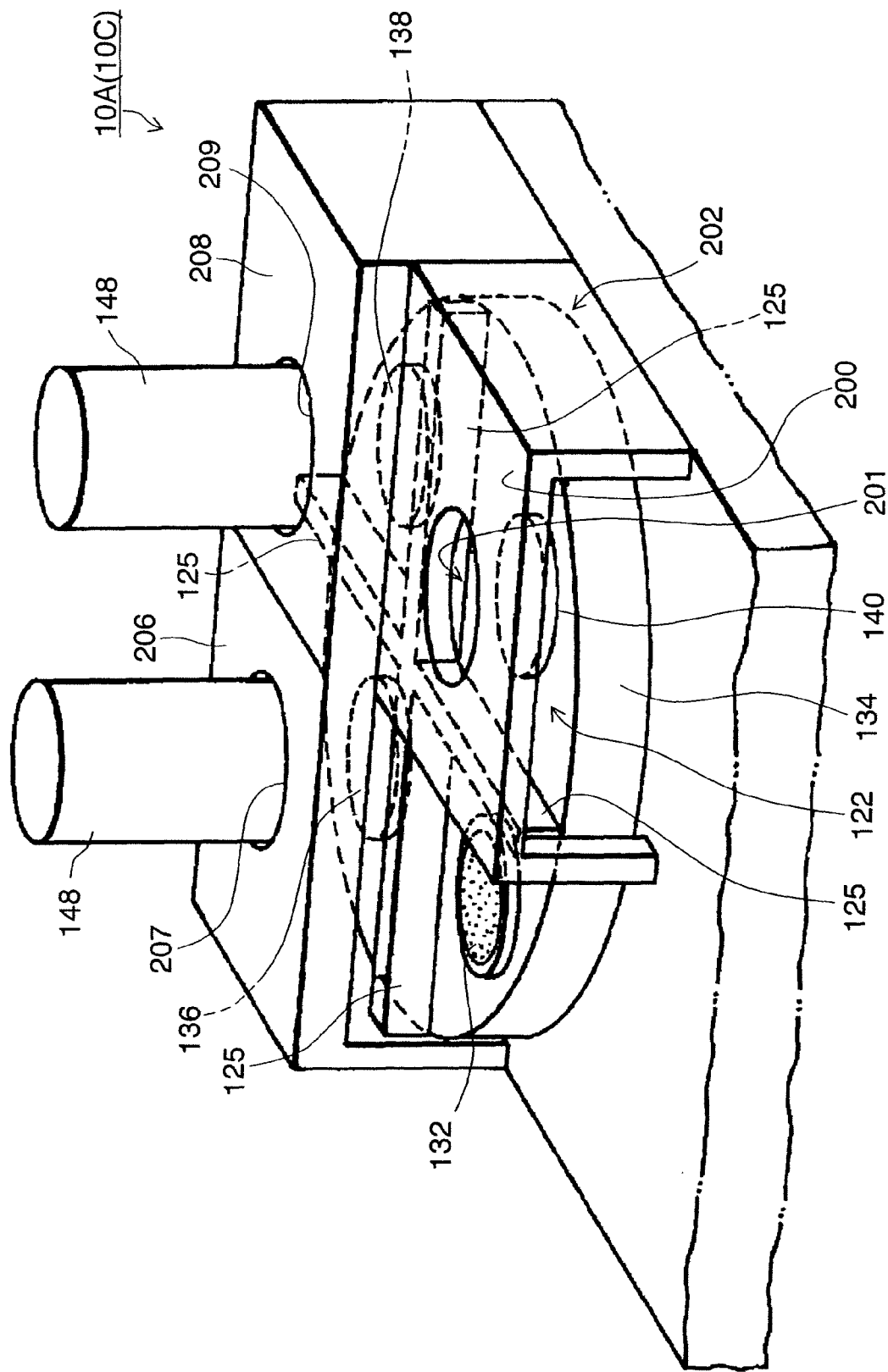
FIG. 5 is a perspective view showing a partition plate of the surface machining apparatus shown in FIG. 2.
Figure 6:
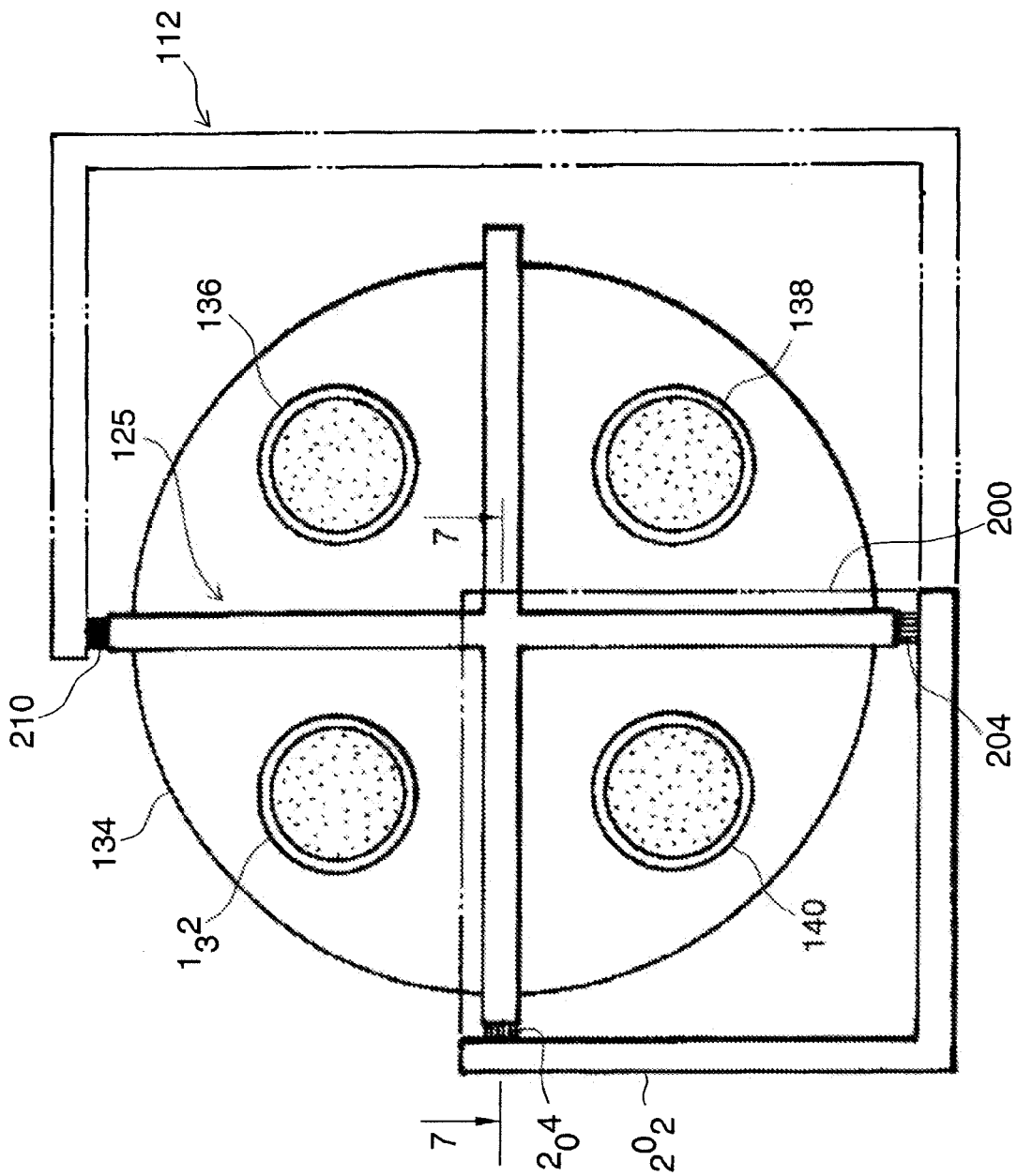
FIG. 6 is a plan view of the partition plate shown in FIG. 5.

As shown in FIGS. 5 and 6, the partition plate 125 is fixed to an index table 134 and cross-shaped to separate four chucks (equivalent to holding means) 132, 136, 138 and 140 mounted on the index table 134 from each other. The polishing stage 122 is covered with a casing 202 having a top plate 200 so as to be isolated from other stages.

Figure 7:
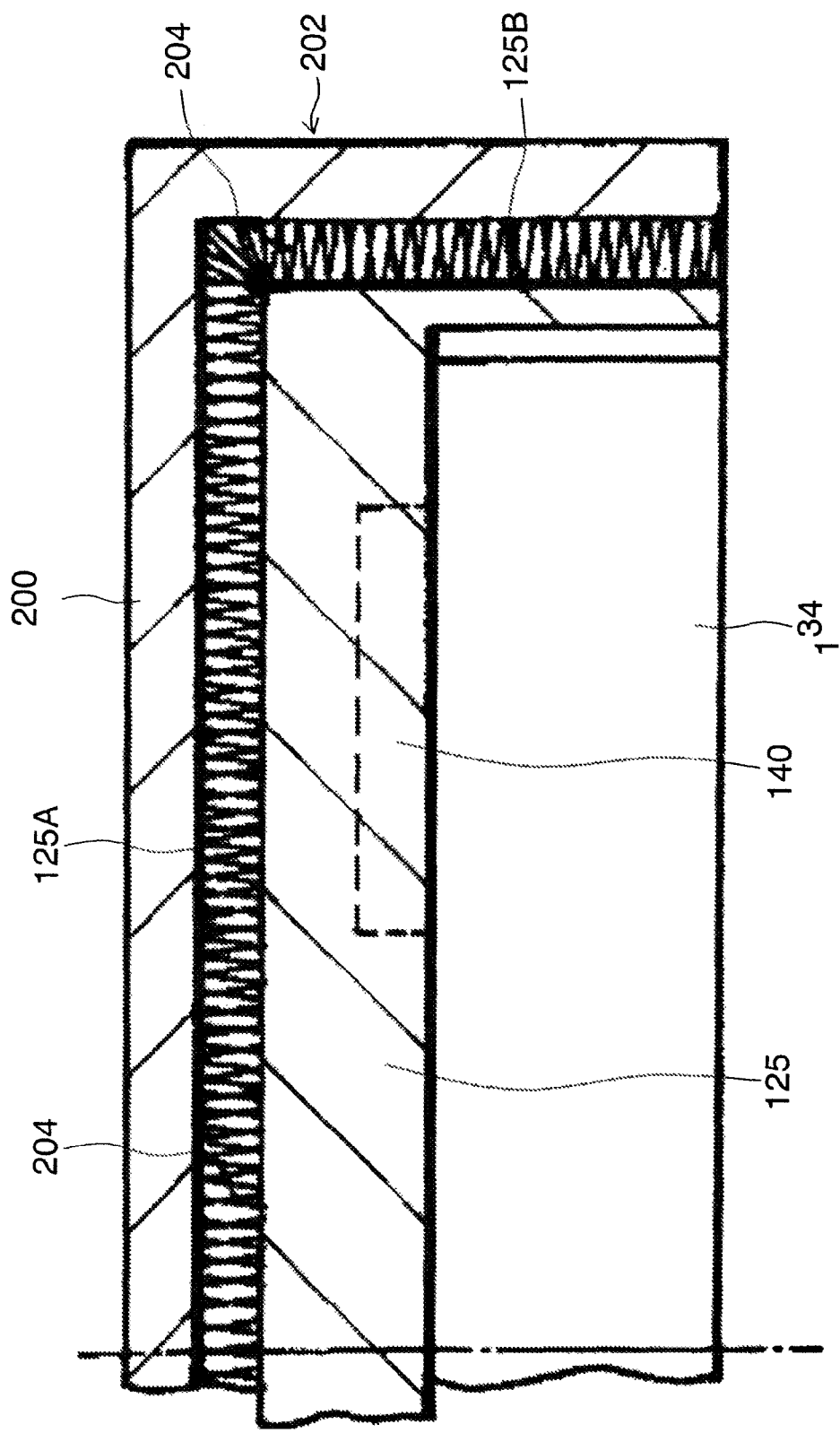
FIG. 7 is a sectional view taken along line 7-7 of FIG. 6 showing the partition plate.

The casing 202 is fitted with a brush 204 on a side surface on which the partition plate 125 passes, as shown in FIG. 7. The brush 204 is brought into contact with a top surface 125A and a side surface 125B of the partition plate 125 when the chuck 140 assumes its working position.

Thus, when the chuck 140 is in the working position, the polishing stage 122 is held in a substantially air-tight condition by the casing 202, partition plate 125 and brush 204. For this reason, it is possible to prevent a grinding liquid used in the precision grinding stage 120 and grinding swarf produced therein from intruding into the polishing stage 122, as well as to prevent a polishing liquid used in the polishing stage 122 from scattering therefrom.

Thus, a machining problem caused by mixing of the machining liquids used in the two stages can be prevented. The polishing stage 122 according to the present embodiment is configured to perform chemical mechanical polishing using the polishing liquid containing a chemical polishing agent. When the grinding liquid is mixed into such a polishing liquid, the chemical polishing agent concentration is lowered to give rise to a problem that the machining time becomes longer. The provision of the partition plate 125 can eliminate this problem.

As shown in FIGS. 5 and 6, the rough grinding stage 118 is surrounded by a side surface of the main body 112, a top plate 206 and the partition plate 125 and, similarly, the precision grinding stage 120 is surrounded by a side surface of the main body 112, a top plate 208 and the partition plate 125. The top plates 200, 206 and 208 are formed with through-holes 201, 207 and 209, respectively, into which heads of respective stages are inserted.

Reference numeral 210 in FIG. 6 designates a brush for isolating the rough grinding stage 118 from the outside. The brush 210 is brought into contact with a top surface and a side surface of the partition plate 125.

Two cassettes 126, 126 are removably set on the cassette storage stage 114 shown in FIGS. 2 and 3. These cassettes 126, 126 each store therein a multiplicity of wafers W in a state before back grinding. These wafers W are sequentially conveyed to the subsequent alignment stage 116 by a conveyor robot 130 having a hand 131 holding the wafers W one by one.

The conveyor robot 130 may be either supported as suspended from a non-illustrated beam standing on the main body 112 via a hoist device or mounted on an upper surface 112A of the main body 112. The conveyor robot 130, when supported as suspended, allows the spacing between the cassette storage stage 114 and the alignment stage 116 to be narrowed, which can contribute to a reduction in the size of the surface machining apparatus 10A (10C). The robot 130 is a general-purpose 6-axis articulated robot. Since the construction of such a robot is well known, description thereof is omitted herein.

The alignment stage 116 is a stage configured to align each wafer W conveyed from the cassette 126 with a predetermined position. The wafer W thus aligned on the alignment stage 116 is attracted and held on the hand 131 of the conveyor robot 130 again, conveyed toward the chuck 132 in a free state and then attracted and held on an attracting surface of the chuck 132.

The chuck 132 is mounted on the index table 134. The chucks 136, 138 and 140 each having the same function are positioned on a circumference about a rotating shaft 135 of the index table 134 depicted by broken line in FIG. 3 at intervals of 90 degrees.

The rotating shaft 135 is coupled to a spindle (not shown) of a motor (equivalent to moving means) 137 depicted by broken line in FIG. 3. The chuck 136 is located on the rough grinding stage 118 where the wafer W attracted thereon is subjected to rough grinding.

The chuck 138 is located on the precision grinding stage 120 where the wafer W attracted thereon is subjected to finish grinding (precision grinding, or spark-out grinding). The chuck 140 is located on the polishing stage 122 where the wafer W attracted thereon is polished to eliminate a work affected layer produced by grinding as well as uneven thickness components of the wafer W.

Figure 4:
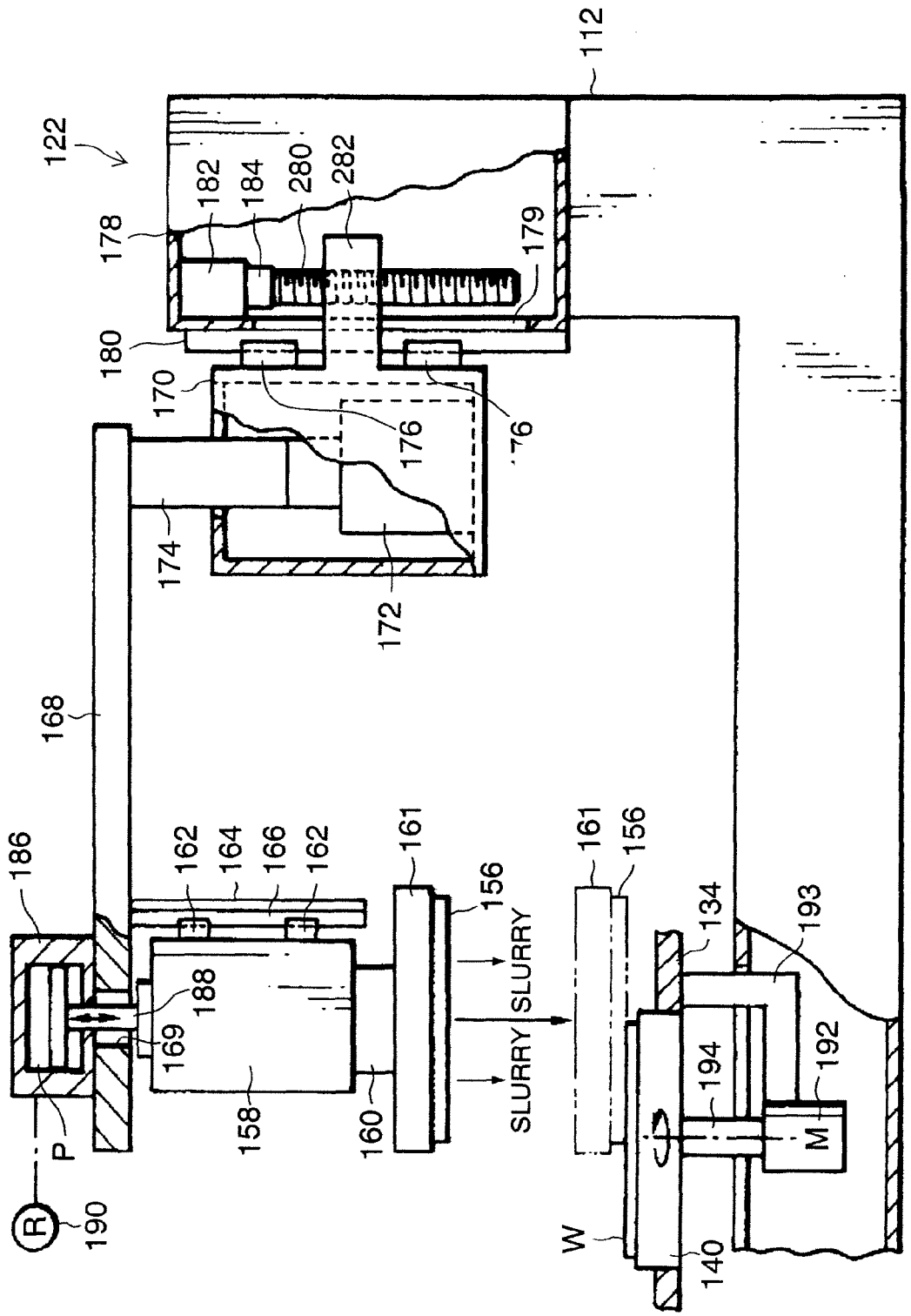
FIG. 4 is a sectional view showing the structure of a grinding stage of the surface machining apparatus shown in FIG. 2.

Each of the chucks 132, 136, 138 and 140 has an underside coupled to a spindle 194 and a motor 192 as shown in FIG. 4. These chucks are each rotated by the driving power of a respective one of the motors 192. The motors 192 are each supported on the index table 134 via a support member 193.

Thus, the surface machining apparatus 10A (10C) is an apparatus configured to move the chucks 132, 136, 138 and 140 by means of the motor 137, with the motor 192 and spindle 194 being coupled to each of the chucks 132, 136, 138 and 140.

This arrangement can eliminate the time and labor required to detach the spindles 194 from the respective chucks 132, 136, 138 and 140 every time the chucks 132, 136, 138 and 140 are moved by the motor 137 and to couple the chucks 132, 136, 138 and 140 to the respective spindles 194 each located at a next moved position.

Each of the chucks 132, 136, 138 and 140 according to the present embodiment has an attracting surface formed from a porous material comprising a sintered substance such as a ceramic. Thus, the wafer W can be firmly attracted and held on the surface of the porous material.

The attracting surface of the chuck 132 located in a position for chucking the wafer W shown in FIG. 3 is cleaned by a cleaner device 142 (see FIG. 3) before the wafer W is conveyed thereto. The cleaner device 142 is slidably mounted on a rail 144. The cleaner device 142 slides on the rail 144 to above the chuck 132 before cleaning the attracting surface.

The cleaner device 142 has a remover member 143 which comes into contact with the attracting surface of the chuck 132 to remove dust, such as sludge, deposited on the attracting surface. When the attracting surface of the chuck 132 is formed from a porous material comprising a sintered substance such as a ceramic, the same porous material is used for the remover member 143.

The thickness of the wafer W attracted and held on the chuck 132 may be measured by a pair of measuring gauges 136 and 138 for example. These measuring gauges 136 and 138 have respective non-illustrated contactors, one contacting an upper surface (reverse side) of the wafer W, the other contacting an upper surface of the chuck 132. The measuring gauges 136 and 138 can detect the thickness of the wafer W as a difference between in-process gauge readouts and the upper surface of the chuck 132 serving as a reference point.

The wafer W thus measured for its thickness becomes positioned on the rough grinding stage 118 by 90° rotation of the index table 134 in the direction of arrow A in FIGS. 2 and 3. The reverse side of the wafer W is roughly ground by means of a straight cup grinding wheel 146 of the rough grinding stage 118.

As shown in FIG. 2, the straight cup grinding wheel 146 is coupled to a non-illustrated output shaft of a motor 148 and mounted to a grinding wheel feeder device 152 via an intervening casing 150 supporting the motor 148. The grinding wheel feeder device 152 is configured to move the straight cup grinding wheel 146 up and down together with the motor 148. When the straight cup grinding wheel 146 is moved down, the straight cup grinding wheel 146 is pressed against the reverse side of the wafer W.

In this way, rough grinding of the reverse side of the wafer 126 is performed. The amount of downward movement of the straight cup grinding wheel 146, i.e., the amount of grinding by the straight cup grinding wheel 146 is established based on a reference position of the straight cup grinding wheel 146 previously recorded and the thickness of the wafer W detected by the measuring gauges 236 and 238.

The wafer W, the reverse side of which has been roughly ground in the rough grinding stage 118, is measured for its thickness by means of a non-illustrated thickness measuring gauge after the straight cup grinding wheel 146 has been retracted from the wafer W. The wafer W thus measured for its thickness becomes positioned on the precision grinding stage 120 by 90° rotation of the index table 134 in the same direction as noted above and is subjected to precision grinding, or spark-out grinding by means of a straight cup grinding wheel 154.

Since the structure of the precision grinding stage 120 is the same as that of the rough grinding stage 118, description thereof is omitted herein. While the two grinding stages are provided in the present embodiment, only one grinding stage can serve the purpose. The thickness measurement by the measuring gauge may be conducted in an in-line manner.

The wafer W, the reverse side of which has been subjected to precision grinding in the precision grinding stage 120, is measured for its thickness by means of a non-illustrated thickness measuring gauge after the straight cup grinding wheel 154 has been retracted from the wafer W. The wafer W thus measured for its thickness becomes positioned on the polishing stage 122 by 90° rotation of the index table 134 in the same direction as noted above. The wafer W is polished by means of abrasive cloth 156 and slurry supplied therefrom, which are shown in FIG. 4, so that a work affected layer formed on the reverse side is eliminated. The thickness measurement by the measuring gauge may be conducted in an in-line manner.

FIG. 4 is a view showing the structure of the polishing stage 122. The abrasive cloth 156 of the polishing stage 120 shown in FIG. 4 is attached to a polishing head 161 coupled to an output shaft 160 of a motor (equivalent to rotating means) 158. The motor 158 has a side surface provided with guide blocks 162, 162 forming direct driving guides. The guide blocks 162, 162 engage a guide rail 166 mounted on a side surface of a support plate 164 for vertical movement. Accordingly, the abrasive cloth 156, together with the motor 158, is vertically movably mounted to the support plate 164.

The support plate 164 is mounted at a tip of a horizontally positioned arm 168 in a continuous length. The arm 1168 has a base end connected to an output shaft 174 of a motor 172 disposed in a casing 170. Accordingly, when the motor 172 is driven, the arm 168 can rotate about the output shaft 174.

Thus, the abrasive cloth 156 can move within a range defined among a polishing position indicated by solid line in FIG. 2, an abrasive cloth cleaning position on the abrasive cloth cleaning stage 123 and a dressing position on the abrasive cloth dressing stage 127. When the abrasive cloth 156 is moved to the abrasive cloth cleaning position, the abrasive cloth cleaning stage 123 cleans the surface of the abrasive cloth 156 to remove polishing swarf and the like deposited thereon.

Examples of such abrasive cloth 156 include foamed polyurethane, abrasive cloth, and the like. The abrasive cloth cleaning stage 123 is provided with a remover member, such as a brush, for removing polishing swarf. The remover member is driven to rotate during cleaning of the abrasive cloth 156. The abrasive cloth 156 is also driven to rotate by the motor 158 (see FIG. 4). The same material as the abrasive cloth 156, for example, foamed polyurethane, is used for the abrasive cloth dressing stage 127.

A casing 170 has a side surface provided with guide blocks 176, 176 forming direct driving guides. The guide blocks 176, 176 are vertically movably engaged by a guide rail 180 mounted on a side surface of a housing 178 of a feed screw unit. A nut member 182 projects from the side surface of the casing 170.

The nut member 182 extends into the housing 178 through an opening 179 defined by the housing 178 and threadingly engages a threaded rod 181 of the feed screw unit (equivalent to a feeding mechanism for positioning). The threaded rod 181 has an upper end coupled to an output shaft 184 of a motor 183.

When the motor 183 is driven to rotate the threaded rod 184, the casing 170 is moved vertically by a feeding action of the feed screw unit and a straight-ahead action by the guide blocks 176 and the rail 180. Thus, the abrasive cloth 156 is moved largely in the vertical direction so as to provide a predetermined spacing between the polishing head 161 and the wafer W.

A piston 188 of an air cylinder device (equivalent to a pressurizing mechanism) 186 is coupled to an upper surface of the motor 158 through a through-hole 169 of the arm 168. The air cylinder device 186 is connected to a regulator 190 which controls an internal pressure P of the cylinder. Thus, the pressing force (i.e., pressure-contact force) of the abrasive cloth 156 against the wafer W can be controlled by the regulator 190 controlling the internal pressure P.

After the abrasive cloth 156 has been retracted from the position above the wafer W by rotation of the arm 168, the wafer W polished by the polishing stage 122 is attracted and held by a hand 197 of a robot 196 shown in FIG. 3 and then conveyed to the wafer cleaning stage 124. The robot 96 is not shown in FIG. 2.

The wafer W finished with polishing, from which the work affected layer has been removed, is hard to damage and hence cannot be damaged during conveyance by the robot 196 and during cleaning in the wafer cleaning stage 124.

A stage having a rinsing function and a spin-drying function is used as the wafer cleaning stage 124. The wafer W finished with cleaning and drying in the wafer cleaning stage 124 is attracted and held by a hand 131 of a robot 130 and then stored on a predetermined shelf in the cassette 126. The wafer surface machining process (first and second machining steps) by the surface machining apparatus 10A (10C) proceeds as described above.

Figure 8:
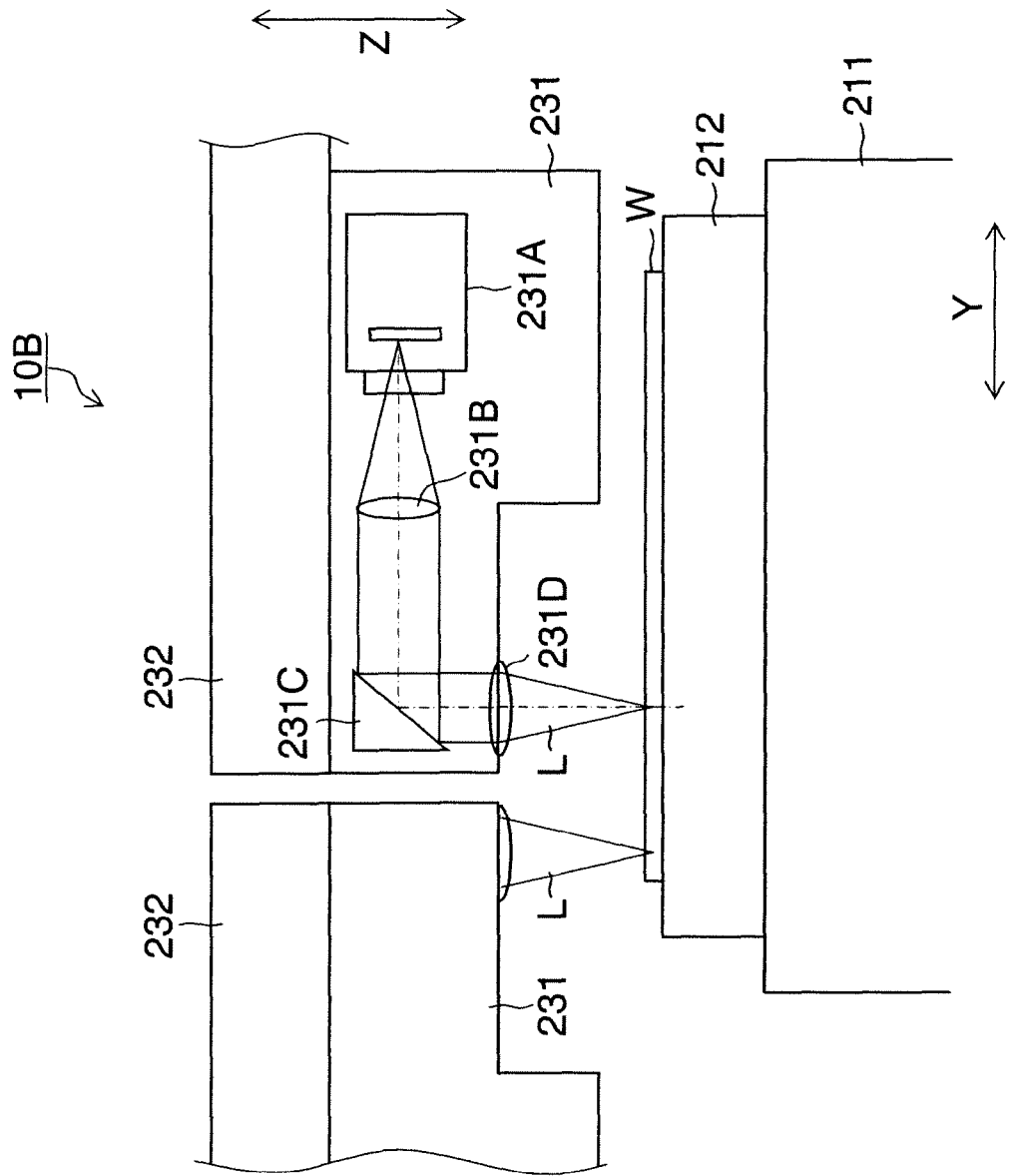
FIG. 8 is a side elevational view schematically showing the construction of a laser dicing apparatus.

Description will be made of the construction of the laser dicing apparatus 10B. FIG. 8 is a side elevational view schematically showing the construction of the laser dicing apparatus 10B.

The laser dicing apparatus 10B is a double-headed apparatus including a chuck table 212, non-illustrated guide bases (including an X guide base, a Y guide base, and a Z guide base), laser heads 231, 231, non-illustrated control means, and the like.

The chuck table 212 attracts and places the wafer W thereon and is rotated in a θ direction by a non-illustrated θ rotating shaft while being fed in an X-direction (perpendicular to the drawing sheet surface) for working by means of a non-illustrated X table mounted on the X guide base.

The non-illustrated Y guide base is located above the chuck table 212. Two non-illustrated Y tables are mounted on the Y guide base and provided with two pairs of non-illustrated Z guide rails, respectively. Non-illustrated Z tables are provided on the respective pairs of Z guide rails. Each laser head 231 is mounted on a respective one of the Z tables via a holder 232. Thus, the two laser heads 231, 231 can be moved in a Z-direction independently of each other while being indexed in a Y-direction independently of each other.

The laser dicing apparatus 10B comprises other non-illustrated components including wafer conveyor means, a control panel, a television monitor, indicator lamps, and the like.

The control panel is attached with switches for operating different parts of the laser dicing apparatus 10B, and a display device. The television monitor displays an image of a wafer picked up by a non-illustrated CCD camera, or the contents of a program and various messages and the like. The indicator lamps indicate operating conditions of the laser dicing apparatus 10B including a condition in operation, a condition finished with operation, and an emergency stopped condition.

Each laser head 231 is positioned above the wafer W placed on the chuck table 212 mounted on a base 211 of the laser dicing apparatus 10B so as to irradiate laser light L to the wafer W.

The laser head 231 includes a laser oscillator 231A, a collimator lens 231B, a mirror 231C, a condenser lens 231C, and the like. As shown in FIG. 8, laser light L produced by oscillation by the laser oscillator 231A is turned into horizontal parallel rays by the collimator lens 231B, reflected in the vertical direction by the mirror 231C, and then focused by the condenser lens 231D.

When laser light L has a focal point set on the thicknesswise interior of the wafer W placed on the chuck table 212, energy of laser light L passing through the surface of the wafer W is concentrated on the focal point to form a modified region, such as a cracked region, a melted region, or a refractive index changed region, in the vicinity of the focal point inside the wafer W by multiphoton absorption.

The laser head 231 has a non-illustrated tilting mechanism which allows laser light L to be irradiated to the wafer W at a desired tilt angle to the wafer surface.

Figure 18:
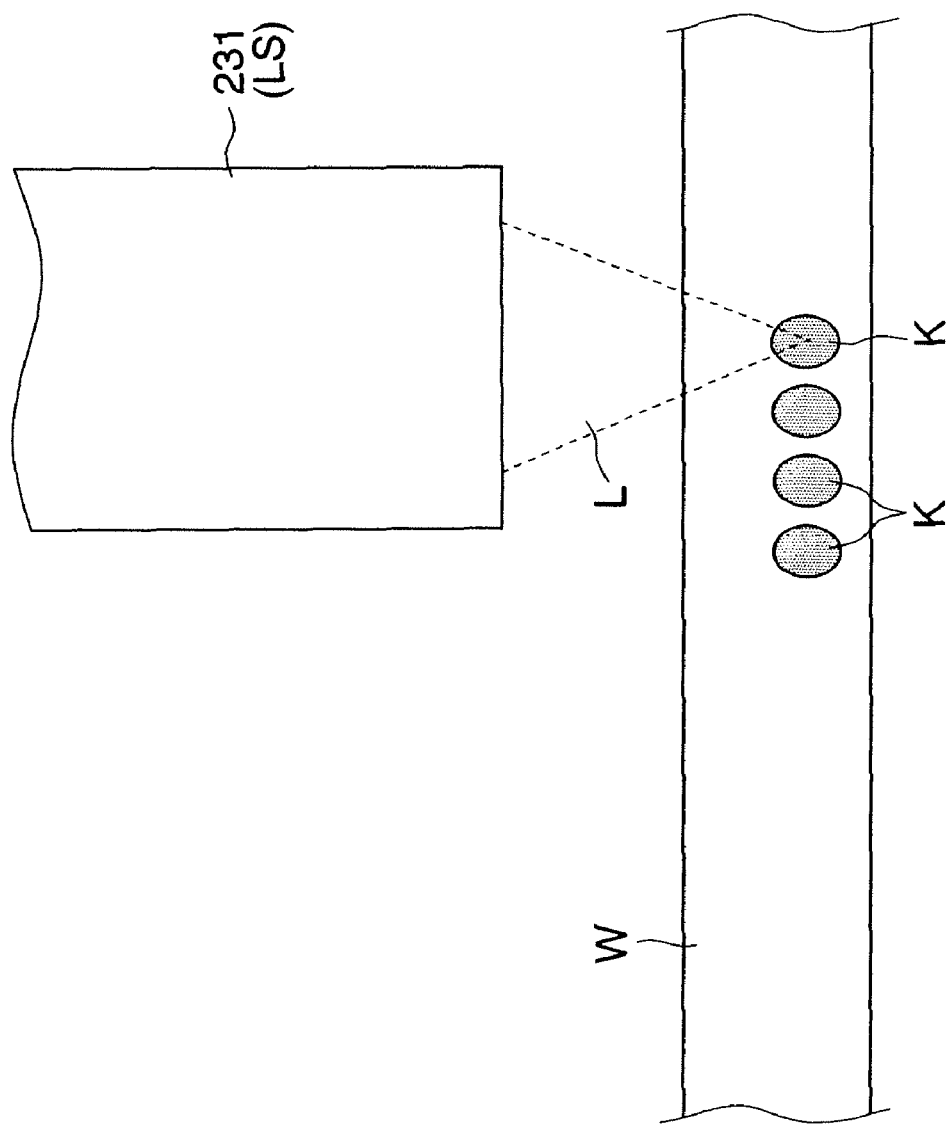
FIG. 18 is a sectional side elevation view showing the principle of laser dicing.

The modified region K formed in the vicinity of the focal point inside the wafer is as described earlier with reference to FIG. 18. FIG. 18 shows a state in which the modified region K is formed at the focal point by laser light L incident on the interior of the wafer W. With laser light L in this condition, the wafer W is moved horizontally to form contiguous modified regions K.

The wafer W is dividedly cut from the modified regions K, K, . . . as starting points either spontaneously or by exerting a slight external force thereon. In this case, the wafer W can be divided into chips easily without occurrence of chipping on the obverse and reverse sides of the wafer W.

Figure 16:
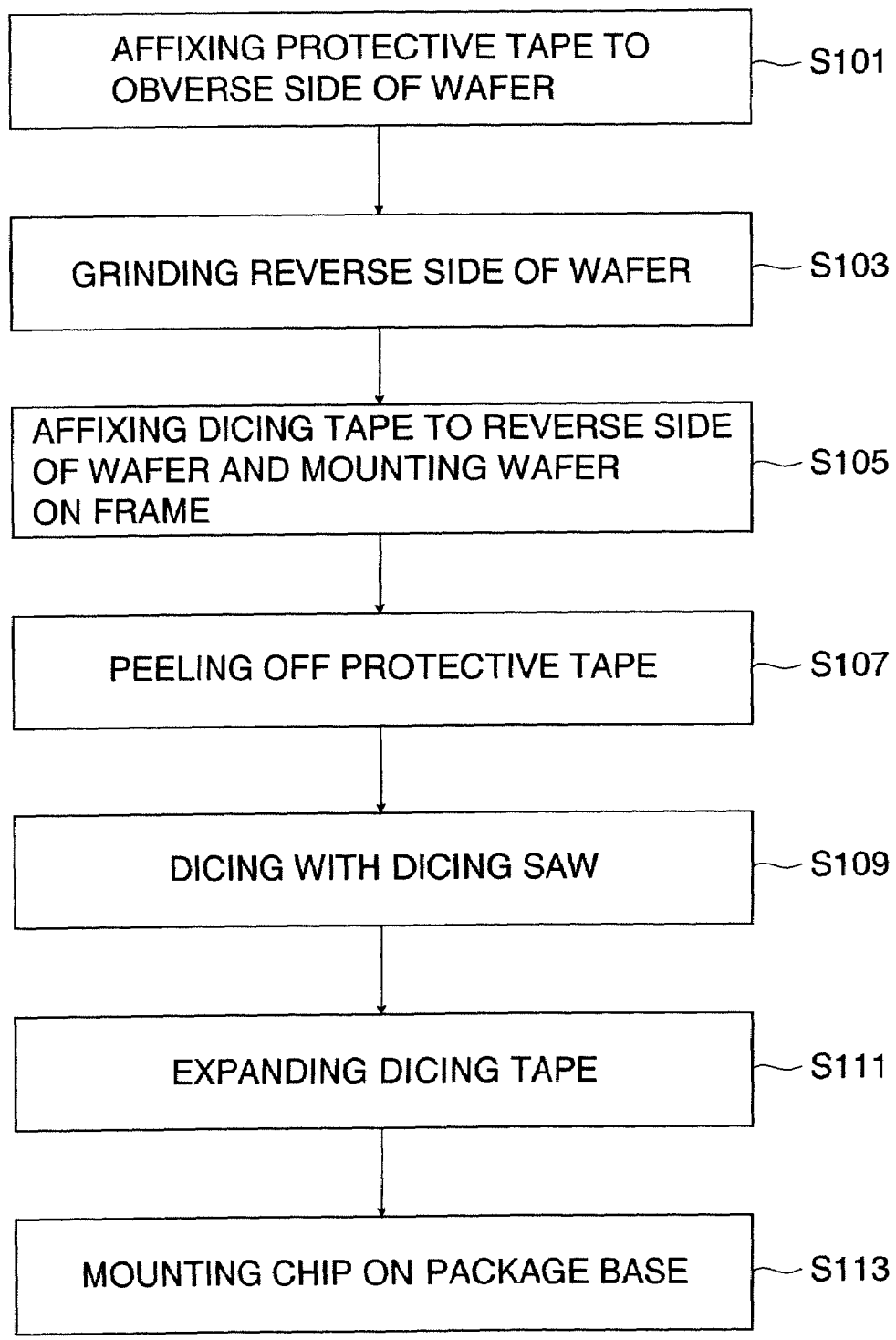

When the wafer W is subjected to laser dicing by the laser dicing apparatus 10B, it is a usual practice to mount the wafer W on a dicing frame F via a dicing sheet S having adhesive on one side thereof, as shown in FIG. 16. During the laser dicing step, the wafer W is conveyed in this state.

Description will be made of the construction of the wafer mounting apparatus 10D. FIG. 9 is a plan view schematically showing the construction of the wafer mounting apparatus 10D. FIG. 10 is a side elevational view schematically showing an operation sequence of the wafer mounting apparatus 10D after UV light irradiation.

The wafer mounting apparatus 10D includes a tape mount (tape mounting means) 11, a tape remover (tape peeling means) 12, a tape expander (expanding means) 13, a plasma cleaning device (cleaning means) 19, and a UV irradiation device (UV irradiation means) 18. Further, there are provided a frame stocker (frame supplying means) 15 located in the vicinity of the tape mount 11, a ring stocker (retainer ring supplying means) 17 located in the vicinity of the expander 13, and a cassette stocker (wafer storage means) 14.

The wafer W having been subjected to laser dicing is conveyed to the wafer mounting apparatus 10D by means of an attracting pad 42 of a full-face attraction type conveyor device 41. As already described, the wafer W is affixed with the protective sheet 21 protecting the pattern formed on the obverse side thereof and laser-diced after the reverse side thereof has been ground and polished flat. The wafer W is attracted on the attracting pad 42, with its obverse side affixed with the protective sheet 21 being oriented downward.

The wafer W conveyed to the wafer mounting apparatus 10D by the conveyor device 41 is conveyed to the plasma cleaning device 19 first. The plasma cleaning device 19 produces plasma of oxygen, hydrogen or the like, and applies the plasma to the wafer W to remove organic contaminants remaining on the wafer W thereby improving the quality of the modified region formed by laser dicing. By so doing, the occurrence of chipping during expanding can be suppressed. For example, an atmospheric-pressure plasma cleaning device (product name: Aiplasma) manufactured by Matsushita Electric Works, Ltd. can be suitably used as the plasma cleaning device 19.

Figure 11:
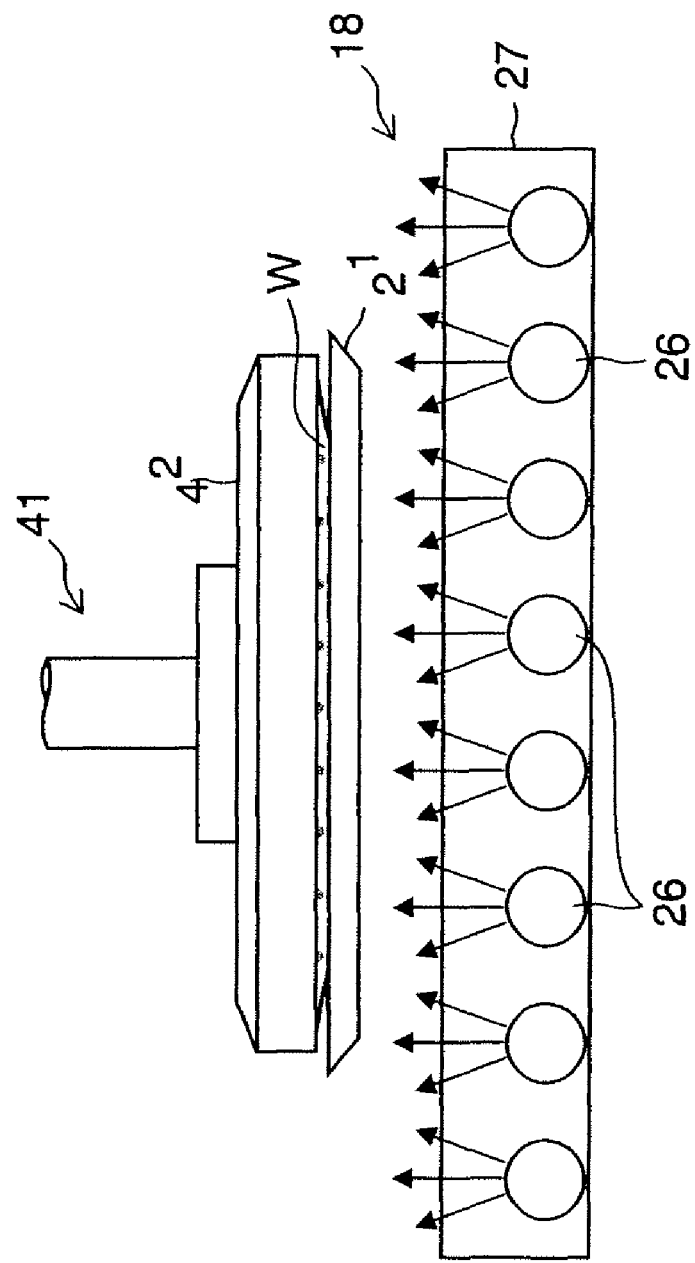
FIG. 11 is a side elevational view schematically showing the structure of a UV light irradiation device of the wafer mounting apparatus.

The wafer W thus cleaned by the plasma cleaning device 19 is conveyed to the UV irradiation device 18. As shown in FIG. 11, the UV irradiation device 18 includes a plurality of UV-emitting tubes 26, 26, . . . arranged parallel in a case 27 and is configured to emit ultraviolet light upwardly.

When the wafer W passes over the UV irradiation device 18 by the conveyor device 41 conveying the wafer W, the obverse side thereof affixed with the protective sheet 21 is irradiated with UV light, causing the tackiness of the affixed protective sheet 21 to lower. Thus, peeling of the protective sheet 21 becomes easy.

Figure 19:
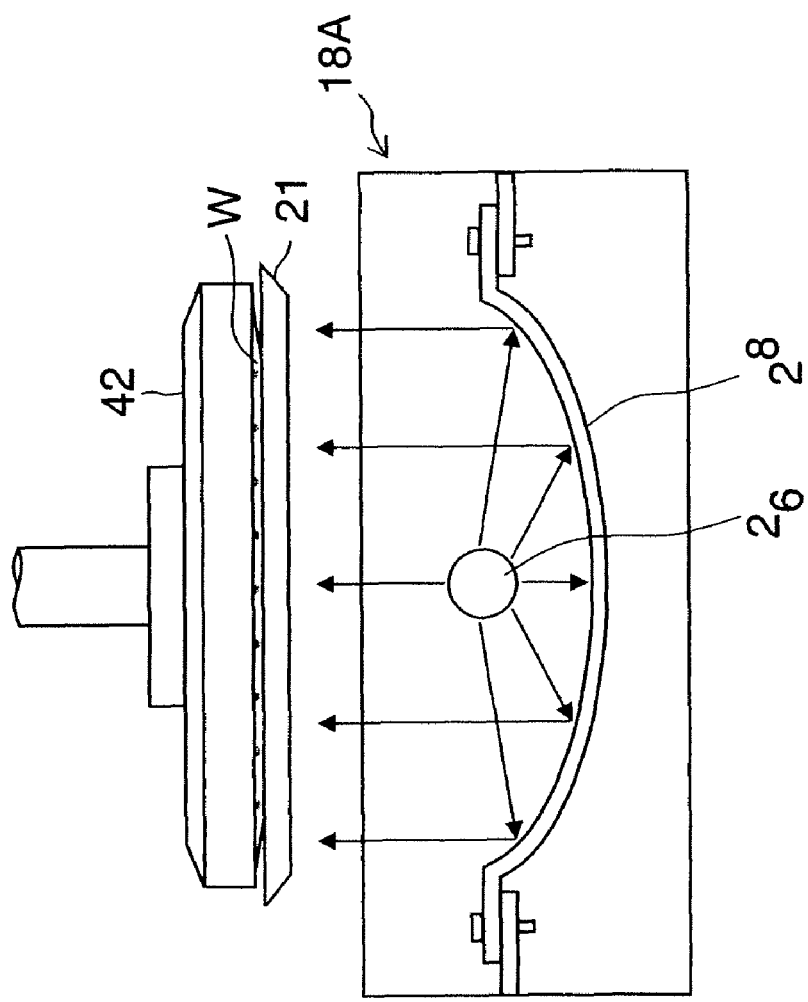
FIG. 19 is a side elevational view schematically showing the structure of another UV light irradiation device.

While description has been made of the UV irradiation device 18 having the structure wherein the UV-emitting tubes 26 are arranged parallel in the case 27, there is no limitation to this structure and it is possible to apply various structures to the UV irradiation device 18, including a structure having a reflecting plate 28 shaped concave in section for upward and parallel reflection of UV light emitted from a UV-emitting tube 26 located centrally of the reflecting plate 28, like a UV irradiation device 18A shown in FIG. 19.

Figure 10A:
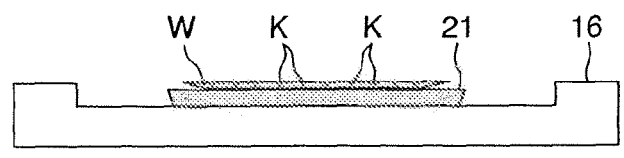
FIGS. 10(a) to 10(f) are side elevational views schematically illustrating an operation sequence of the wafer mounting apparatus after UV light irradiation.

The wafer W past the UV irradiation device 18 is conveyed to a table 16 and placed thereon, with its obverse side affixed with the protective sheet 21 being oriented downward, as shown in FIG. 10(a).

Figure 17:
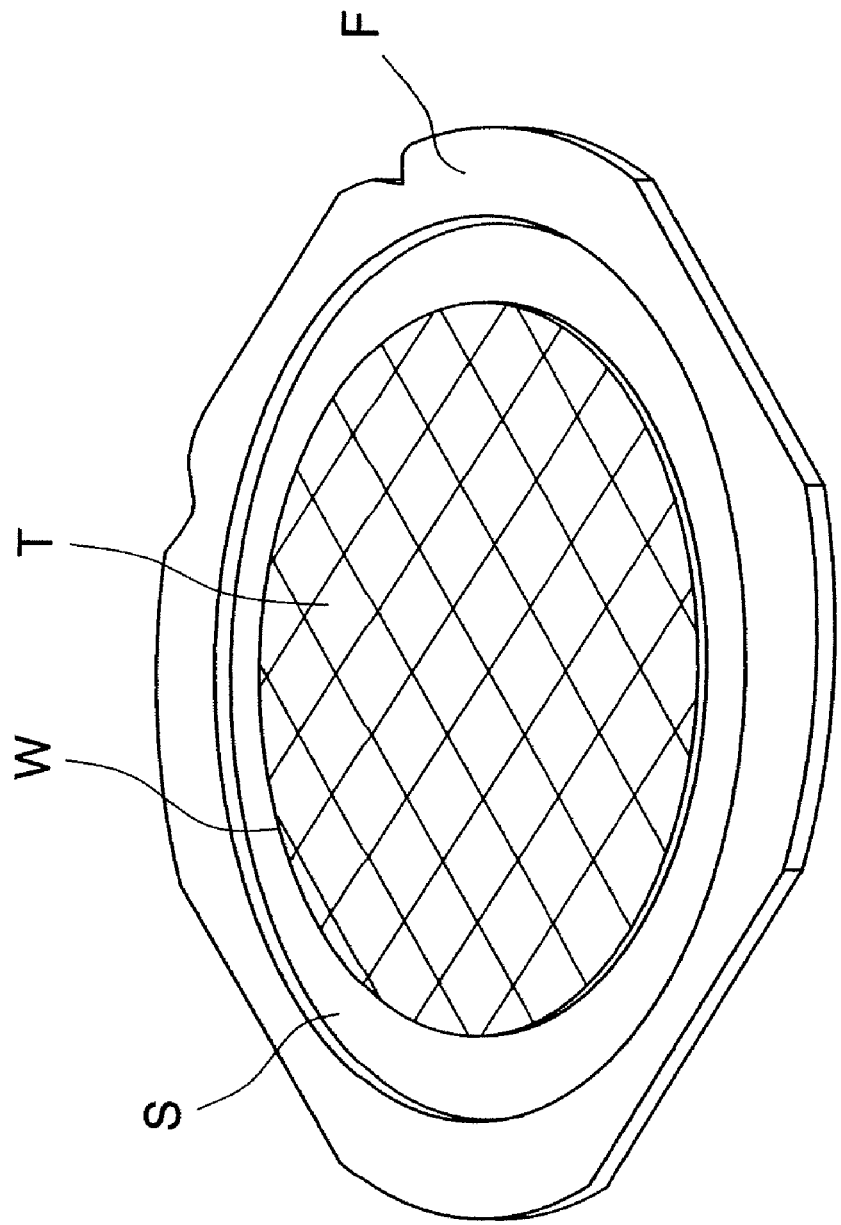
FIG. 17 is a perspective view showing a wafer mounted on a frame.

The table 16, which is provided with a non-illustrated vacuum attraction mechanism, attracts thereon the frame F (see FIG. 17) supplied from the frame stocker 15 by an arm 32 of a conveyor device 31 as well as the wafer W. The table 16 is moved along a guide 36 by a non-illustrated driver device to pass below the tape mount 11.

Figure 10B:
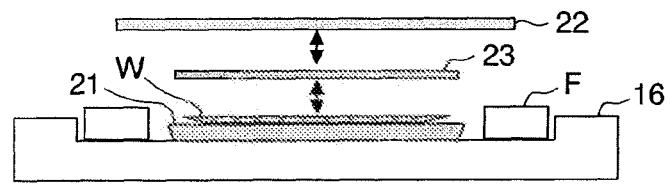
Figure 10C:
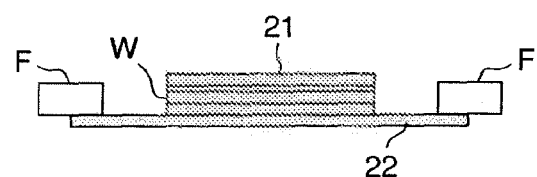

The tape mount 11 is located above the guide 36 and configured to mount the frame F on the reverse side of the wafer W attracted and placed on the table 16 by means of a dicing tape 22, as shown in FIGS. 10(b) and 10(c).

On the tape mount 11, the dicing tape 22 is wound about a feed reel 37. The dicing tape 22 passes through a non-illustrated guide reel and is then taken up in a state expanding parallel with the wafer W by a take-up reel 38.

In mounting the wafer W on the frame F by means of the dicing tape 22, the dicing tape 22 is pressed against and affixed to the frame F and the wafer W positioned below the tape mount 11 by means of a non-illustrated roller provided on the tape mount 11, thereby mounting the wafer W on the frame F.

At that time, a die attach film 23 (hereinafter will be referred to as "DAF") to be used in bonding a diced chip to a base is affixed between the wafer W and the dicing tape 22. By so doing, the die bonding process is simplified to allow the throughput to be improved.

After the dicing tape 22 has been affixed, unnecessary portions are removed by cutting by means of a non-illustrated cutter provided on the tape mount 11.

Figure 10D:
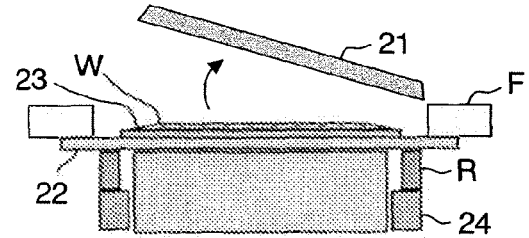

The tape remover 12 is configured to peel off the protective sheet 21 from the obverse side of the wafer W mounted on the frame F by means of the dicing tape 22, as shown in FIG. 10(d).

The wafer W mounted on the frame F is conveyed from the table 16 onto the tape remover 12 by a conveyor device 39 while being inverted to orient the obverse side affixed with the protective sheet 21 upwardly. The protective sheet 21 is peeled off by a non-illustrated arm. Since the tackiness of the protective sheet 21 has been lowered by UV light irradiated by the UV irradiation device 18, the protective sheet 21 can be easily peeled off from the wafer W.

The expander 13 is a device configured to press the retainer ring R supplied from the ring stocker 17 by an arm 34 of a conveyor device 33 from the dicing tape 22 side of the wafer W mounted on the frame F, thereby expanding the wafer W diced.

Figure 10E:
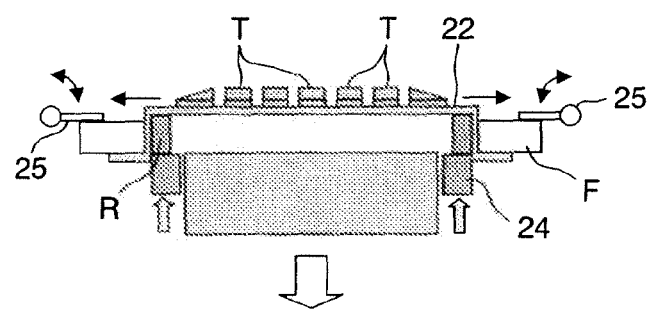

The wafer W from which the protective sheet 21 has been peeled off is conveyed to the expander 13 by a conveyor device 39. As shown in FIG. 10(e), the expander 13 expands the dicing tape 22 radially by pressing the retainer ring R against the dicing tape 22 by means of a lifting mechanism 24, with the frame F fixed by a frame fixing mechanism 25. By so doing, the wafer W is divided into individual chips T.

Figure 10F:
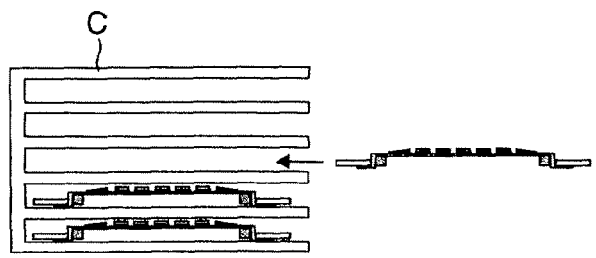

The retainer ring R is a ring for retaining the expanded condition of the wafer W by being fitted into the frame F. After expansion, the wafer W together with the retainer ring R is returned toward the tape remover 12 by the conveyor device 39. The expanded wafer W on the tape remover 12 is moved on a guide 35 by a non-illustrated moving means. Such wafers W are sequentially stored into the cassette C placed in the cassette stocker 14, as shown in FIG. 10(f).

The cassette stocker 14 is a storage device including an elevator for moving the cassette C placed thereon up and down to adjust storage positions sequentially for wafers W. At the time wafers W have been stored in all the storage positions of the cassette C, the cassette C is carried out of the wafer mounting apparatus 10 by a non-illustrated conveyor device to allow a fresh cassette C to be set in the cassette stocker 14.

Figure 12:
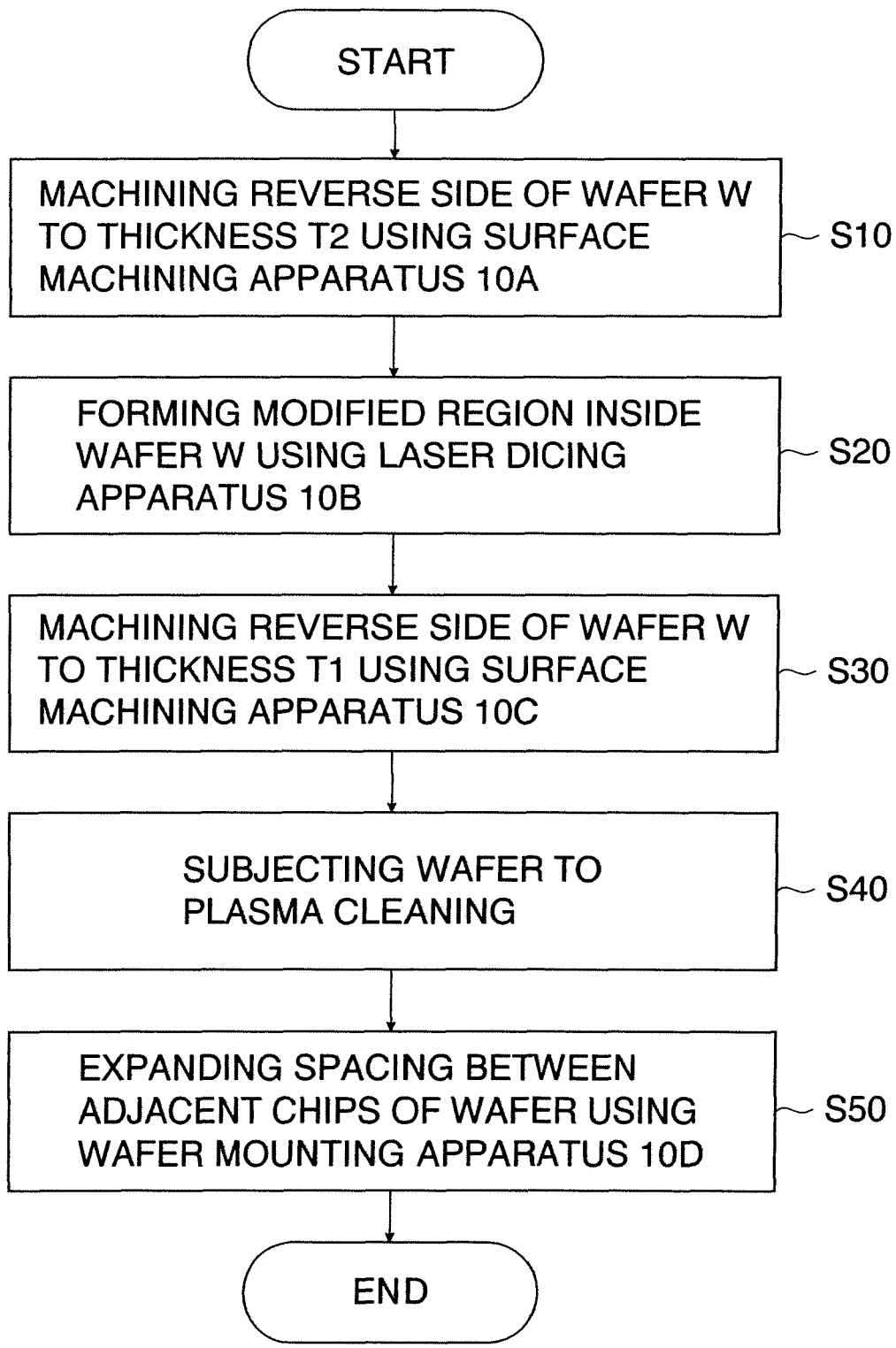
FIG. 12 is a flowchart showing an operation sequence of the wafer working method.

Description will be made of an actual procedure of the wafer working method according to the present invention. FIG. 12 is a flowchart showing an operation sequence of the wafer working method. A wafer W is worked using the wafer working system 10, which has already been described with reference to FIG. 1 and the like.

Initially, the reverse side of the wafer W is machined (ground and polished) to a thickness T2 using the surface machining apparatus 10A (step S10). That is, in a first machining step, the reverse side of the wafer W is machined to the thickness T2 which is larger than a finally worked wafer thickness T1. This step allows the mechanical strength of the wafer W having been diced to be substantially improved. Therefore, the number of occurrences of a problem that the wafer W is undesirably broken up from the internal modified region K as a starting point, is reduced either sharply or to nil even when the wafer W is subjected to some impact or vibration during conveyance between apparatuses used in the respective steps after dicing.

The thickness T2 is preferably larger than the finally worked wafer thickness T1 by 50 μm to 500 μm, more preferably by 100 μm to 300 μm, further more preferably by 150 μm to 250 μm.

Figure 13:
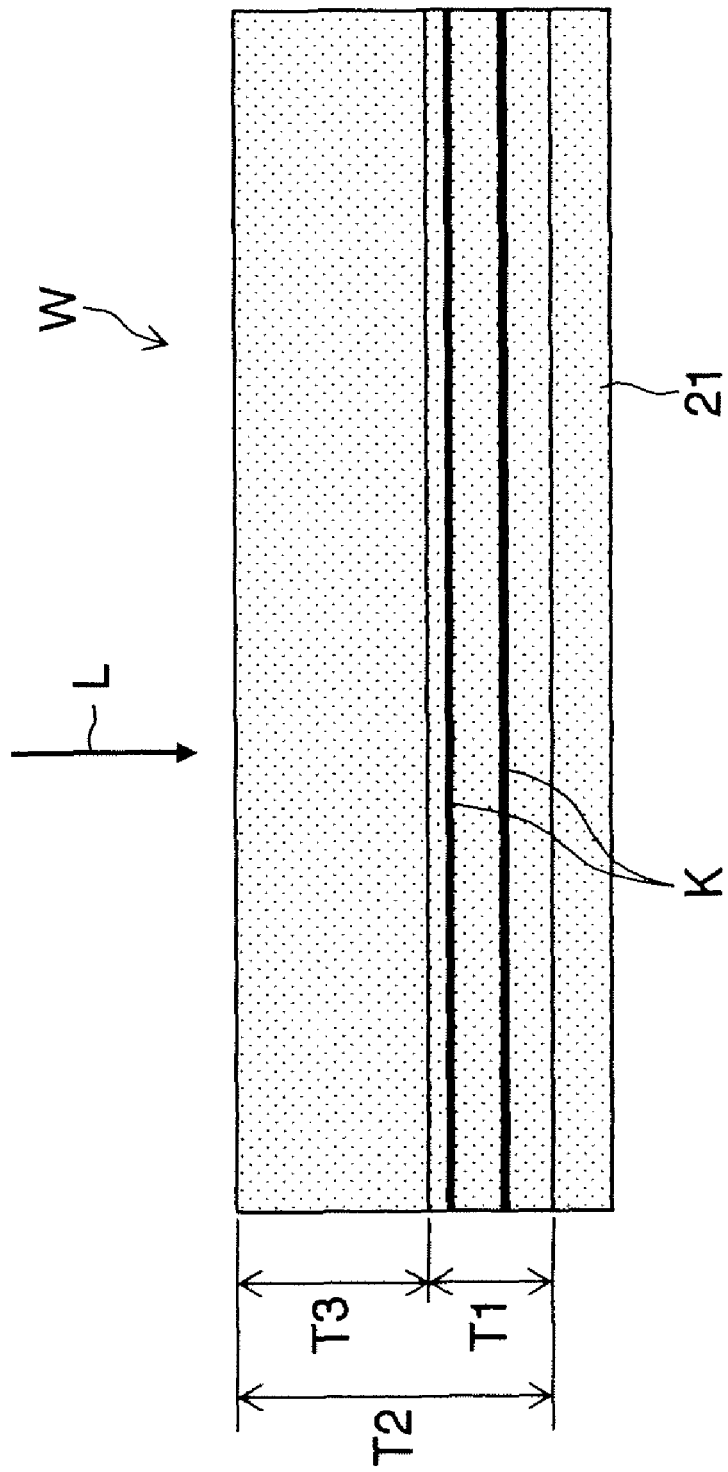
FIG. 13 is a sectional view showing a wafer W affixed with a protective sheet on an obverse side thereof.

FIG. 13 is a sectional view of a wafer W affixed with the protective sheet 21 on the obverse side (i.e., lower side) thereof. In the figure, the wafer W has the thickness T2 larger than the finally worked thickness T1 after the reverse side thereof has been machined.

Subsequently, laser light L is irradiated to the wafer W from the reverse side (i.e., upper side) thereof using the laser dicing apparatus 10B, to form modified regions K, K, . . . inside the wafer W (step S20). The position of the modified regions K, K, . . . in the thickness direction of the wafer W is preferably spaced apart from the obverse side (i.e., lower side) of the wafer W by a distance T1 in the thickness direction. The modified regions thus positioned in the thickness direction allow the wafer to be dividedly cut easily.

Figure 14:
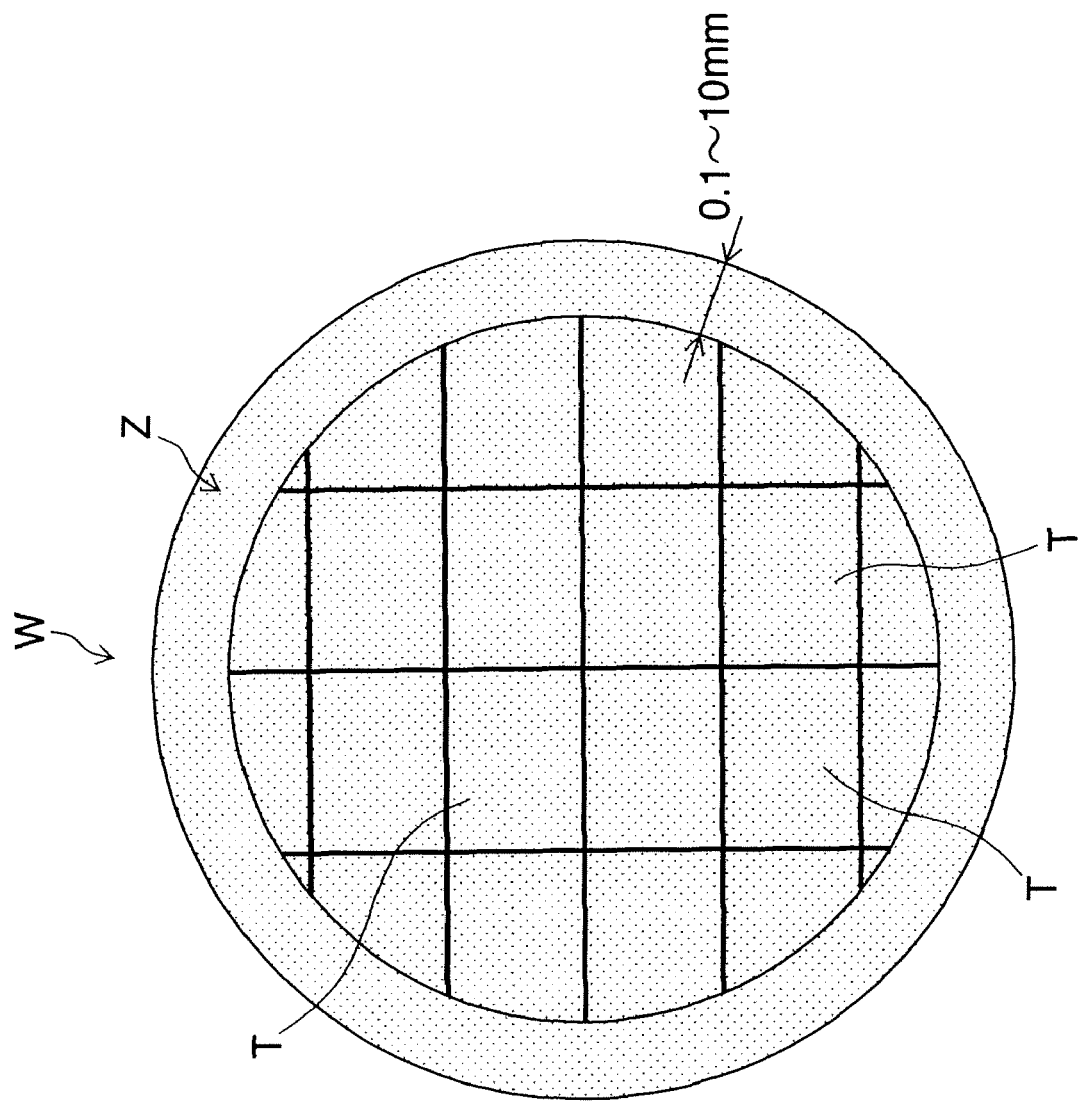
FIG. 14 is a plan view showing a modification-free region of a wafer.

In the plane of the wafer W, the modified regions K, K, . . . have to be positioned on intended dividing lines provided inwardly of a modification-free region Z measuring 0.1 mm to 10 mm from the periphery of the wafer, as shown in FIG. 14.

According to this method, any modified region is not formed in the modification-free region and, hence, the mechanical strength of the wafer W in the modification-free region Z is not lowered. Thus, it is possible to eliminate the problem of chipping from a peripheral portion of the wafer W.

As a result, the phenomenon will not occur that chipping is caught between the grinding wheel and the wafer W to cause a scratch or caught between the polishing pad and the wafer to cause a flaw during machining by the surface machining apparatus 10C in the subsequent step (step S30). Nor will occur the problem that a notch portion or an orientation flat portion of the wafer W is damaged.

Subsequently, the reverse side of the wafer W is machined (ground and polished) to the finally worked wafer thickness T1 using the surface machining apparatus 10C (step S30).

Subsequently, organic contaminants remaining on the wafer W are removed using the plasma cleaning device 19 (step S40).

Figure 15:
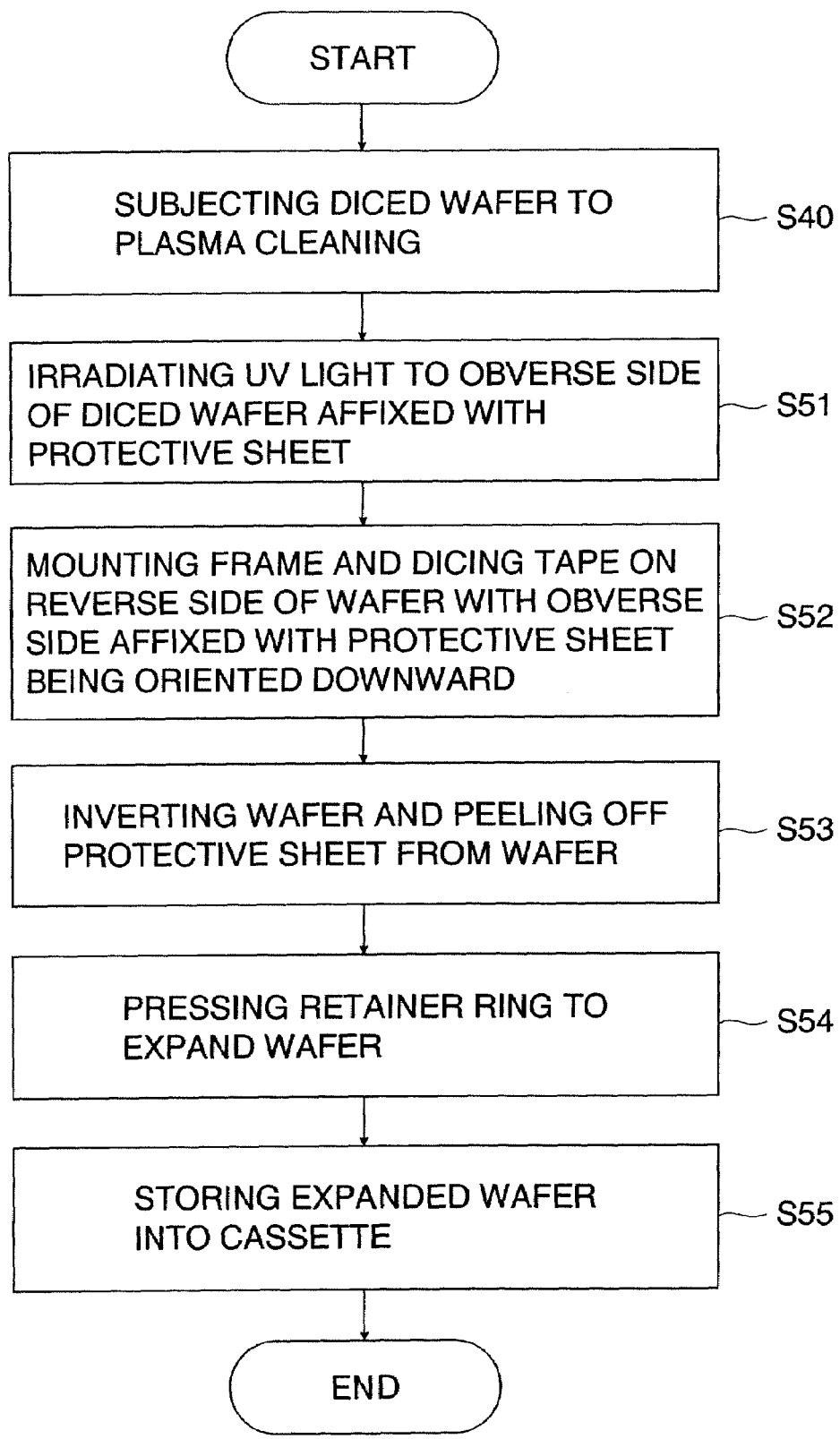
FIG. 15 is a flowchart showing an operation sequence of the wafer mounting apparatus.

Subsequently, the spacing between adjacent chips of the wafer W is expanded using the wafer mounting apparatus 10D (step S50). This expanding step will be described with reference to FIG. 15. FIG. 15 is a flowchart showing an operation sequence of the wafer mounting apparatus. FIG. 10, to which reference has been already made, is a side elevational view schematically showing the operation sequence of the wafer mounting apparatus 10D after UV light irradiation.

Initially, the wafer W is subjected to plasma cleaning in step S40 (preceding step).

The wafer W is attracted on and conveyed by the full-face attraction type conveyor device 41 with its protective sheet 21 side oriented downward, while the UV irradiation device 18 irradiates UV light to the protective sheet 21 to lower the tackiness of the protective sheet 21 (step S51).

Subsequently, the dicing tape 22 is affixed to the reverse side of the wafer W and to the frame F and, after unnecessary portions have been cut off, the wafer W is mounted on the frame F (step S52).

The wafer W thus mounted on the frame F is inverted by the conveyor device 39 and then the protective sheet 21 affixed to the obverse side is peeled off (step S53).

The wafer W is conveyed to the expander 13 and then expanded by pressing the retainer ring R from the dicing tape 22 side (step S54).

Such wafers W thus expanded, together with their respective retainer rings R, are sequentially stored into the cassette C placed in the cassette stocker 14 (step S55).

As has been described above, the wafer working method according to the present invention is capable of dividing a wafer diced by the laser dicing apparatus into chips without any damage to the wafer.

The invention claimed is:

1. A wafer working method characterized by comprising:
   a first machining step of grinding a reverse side of a wafer and then polishing the reverse side of the wafer thus ground to a thickness T2 which is larger than a finally worked wafer thickness T1;
   a modified region forming step of irradiating laser light to a region of the wafer thus subjected to the first machining which lies inwardly of a modification-free zone measuring 0.1 mm to 10 mm from a periphery of the wafer, to form a modified region inside the wafer; and
   a second machining step of grinding the reverse side of the wafer thus formed with the modified region and then polishing the reverse side of the wafer thus ground to the finally worked wafer thickness T1.

2. The wafer working method according to claim 1, further comprising:
   a tape affixing step of affixing a protective tape to an obverse side of the wafer before the first machining for protecting a pattern formed on the obverse side of the wafer;
   an ultraviolet light irradiating step of irradiating ultraviolet light to the obverse side of the wafer having been subjected to the second machining;
   a tape mounting step of affixing a dicing tape to the reverse side of the wafer thus irradiated with ultraviolet light and mounting the wafer on a frame;
   a tape peeling step of peeling off the protective tape affixed to the obverse side of the wafer thus mounted on the frame; and
   an expanding step of expanding spacing between adjacent chips of the wafer by expanding the dicing tape from the dicing tape affixed side of the wafer from which the protective tape has been peeled off.

3. The wafer working method according to claim 1, wherein the modified region formed inside the wafer is positioned apart from the obverse side of the wafer by a distance T1 in a thickness direction.

4. The wafer working method according to claim 1, further comprising a plasma cleaning step of plasma-cleaning the wafer having been subjected to the second machining.

5. The wafer working method according to claim 2, wherein the modified region formed inside the wafer is positioned apart from the obverse side of the wafer by a distance T1 in a thickness direction.

6. The wafer working method according to claim 2, further comprising a plasma cleaning step of plasma-cleaning the wafer having been subjected to the second machining.

7. The wafer working method according to claim 3, further comprising a plasma cleaning step of plasma-cleaning the wafer having been subjected to the second machining.

8. The wafer working method according to claim 5, further comprising a plasma cleaning step of plasma-cleaning the wafer having been subjected to the second machining.

* * * * *